United States Patent
Hong et al.

(10) Patent No.: US 12,507,583 B2
(45) Date of Patent: Dec. 23, 2025

(54) APPARATUS FOR MANUFACTURING DISPLAY APPARATUS AND METHOD OF MANUFACTURING DISPLAY APPARATUS

(71) Applicant: Samsung Display Co., Ltd., Yongin-si (KR)

(72) Inventors: Jungpyo Hong, Yongin-si (KR); Sora Bak, Yongin-si (KR); Jongwoo Park, Yongin-si (KR); Younjae Jung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 654 days.

(21) Appl. No.: 17/808,052

(22) Filed: Jun. 21, 2022

(65) Prior Publication Data

US 2023/0113586 A1 Apr. 13, 2023

(30) Foreign Application Priority Data

Oct. 12, 2021 (KR) ........................ 10-2021-0135221

(51) Int. Cl.
| | |
|---|---|
| B05B 7/22 | (2006.01) |
| B05C 9/14 | (2006.01) |
| C23C 18/16 | (2006.01) |
| H01L 21/67 | (2006.01) |
| H10K 50/844 | (2023.01) |
| H10K 71/13 | (2023.01) |

(Continued)

(52) U.S. Cl.
CPC ........... *H10K 71/421* (2023.02); *B05B 7/228* (2013.01); *B05C 9/14* (2013.01); *C23C 18/1667* (2013.01); *H01L 21/6715* (2013.01); *H10K 50/844* (2023.02); *H10K 71/135* (2023.02); *H10K 59/1201* (2023.02); *H10K 59/131* (2023.02); *H10K 71/851* (2023.02)

(58) Field of Classification Search
USPC ........................... 118/313, 315, 58, 641–643
See application file for complete search history.

(56) References Cited

U.S. PATENT DOCUMENTS

| | | | |
|---|---|---|---|
| 10,879,491 B1 | 12/2020 | Yoo et al. | |
| 11,632,863 B2 | 4/2023 | Ryu et al. | |

(Continued)

FOREIGN PATENT DOCUMENTS

| | | |
|---|---|---|
| CN | 111162195 A | 5/2020 |
| JP | 11-142641 A | 5/1999 |

(Continued)

OTHER PUBLICATIONS

English Translation KR-20120095175-A (Year: 2012).*

(Continued)

*Primary Examiner* — Yewebdar T Tadesse
(74) *Attorney, Agent, or Firm* — Womble Bond Dickinson (US) LLP

(57) ABSTRACT

An apparatus for manufacturing a display apparatus is provided. The apparatus includes a stage that has a first surface and a second surface. A display substrate is arranged on the first surface, and the second surface is opposite to the first surface. The apparatus also includes a jig facing the second surface, a heat transfer unit arranged on the jig and including a protrusion pin protruding toward the second surface, and a laser unit configured to irradiate a laser beam to the heat transfer unit.

9 Claims, 33 Drawing Sheets

(51) Int. Cl.
 *H10K 71/40* (2023.01)
 *H10K 59/12* (2023.01)
 *H10K 59/131* (2023.01)
 *H10K 71/00* (2023.01)

(56) References Cited

U.S. PATENT DOCUMENTS

| | | | |
|---|---|---|---|
| 2005/0245078 | A1 | 11/2005 | Ohnuma et al. |
| 2015/0021568 | A1* | 1/2015 | Gong .................. H10K 59/8722 257/40 |
| 2020/0396849 | A1* | 12/2020 | Ryu ........................ H05K 5/03 |
| 2021/0217992 | A1 | 7/2021 | Moon et al. |

FOREIGN PATENT DOCUMENTS

| | | | |
|---|---|---|---|
| KR | 20120095175 A * | 8/2012 | |
| KR | 10-2015-0011235 A | 1/2015 | |
| KR | 10-2020-0066497 A | 6/2020 | |
| KR | 10-2020-0120766 A | 10/2020 | |
| KR | 10-2020-0143561 A | 12/2020 | |
| KR | 10-2021-0020203 A | 2/2021 | |
| WO | WO-2021172662 A1 * | 9/2021 | .......... B41J 2/04535 |

OTHER PUBLICATIONS

English Translation WO-2021072662-A1 (Year: 2021).*
Dun, Aihuan et al.; "Marangoni effect induced micro/nano-patterning on $SB_2Te_3$ phase change thin film by laser pulse"; Appl Phys A (2011) 103; pp. 139-147.
Namura, Kyoko et al.; "Quasi-stokeslet induced by thermoplasmonic Marangoni effect around a water vapor microbubble"; Scientific Reports; vol. 7, Article No. 45776; Mar. 31, 2017; 8pp.

* cited by examiner

APPARATUS FOR MANUFACTURING DISPLAY APPARATUS AND METHOD OF MANUFACTURING DISPLAY APPARATUS

CROSS-REFERENCE TO RELATED APPLICATION

This application claims priority to and the benefit of Korean Patent Application No. 10-2021-0135221, filed on Oct. 12, 2021, in the Korean Intellectual Property Office, the entire content of which is hereby incorporated by reference.

BACKGROUND

1. Field

One or more embodiments relate to an apparatus for manufacturing a display apparatus and a method of manufacturing a display apparatus.

2. Description of the Related Art

Recently, the usage of display devices has diversified. In addition, as display devices have become thinner and lighter, their range of use has gradually been extended.

As the area occupied by a display area in display apparatuses expands, various suitable functions that are combined or associated with display apparatuses have been added. In order to add various functions while expanding the display area, research is being carried out on display apparatuses having a transmission area surrounded by the display area.

SUMMARY

To provide a transmission area to display apparatuses, an opening area may be provided to a display panel included in the display apparatuses. For example, the display panel may include a display area, the opening area, and a non-display area, the opening area being surrounded by the display area, and the non-display area being between the display area and the opening area. In this embodiment, a stack structure of the non-display area of the display panel may have a bending or curved shape due to various reasons.

One or more embodiments include an apparatus for manufacturing a display apparatus that may be configured to form an organic layer for planarizing a stack structure of a display panel, and a method of manufacturing the display apparatus.

Additional aspects of embodiments of the present disclosure will be set forth in part in the description which follows and, in part, will be apparent from the description, or may be learned by practice of the presented embodiments of the disclosure.

According to one or more embodiments, an apparatus for manufacturing a display apparatus includes a stage including a first surface and a second surface, wherein a display substrate is arranged on the first surface, and the second surface is opposite to the first surface, a jig facing the second surface, a heat transfer unit arranged on the jig and including a protrusion pin protruding toward the second surface, and a laser unit configured to irradiate a laser beam to the heat transfer unit.

The stage may include a stage opening passing through the stage to overlap a region in which the display substrate is arranged.

The apparatus may further include a first heat-dissipating layer arranged on the second surface of the stage.

The apparatus may further include a second heat-dissipating layer covering the protrusion pin.

The heat transfer unit may be detachable from the jig.

One of the jig and the heat transfer unit may include a protrusion protruding toward the other of the jig and the heat transfer unit, and the other of the jig and the heat transfer unit may include an indented portion fit to the protrusion.

The apparatus may further include a first guide configured to guide the jig to move in a first direction, and a second guide configured to guide the jig to move in one of a direction closer to the stage or a direction away from the stage.

The jig may extend in a second direction crossing the first direction, the heat transfer unit may include a plurality of heat transfer units, and the plurality of heat transfer units may be arranged in the second direction on the jig.

The laser unit may move concurrently (e.g., simultaneously) with the heat transfer unit.

The apparatus may further include an organic material discharger configured to discharge an organic material toward the display substrate, and an ultraviolet irradiator configured to irradiate an ultraviolet ray toward the organic material discharged.

According to one or more embodiments, a method of manufacturing a display apparatus includes arranging a display substrate on a stage, the display substrate including a first region, a second region, and a third region, the second region surrounding the first region, and the third region being between the first region and the second region, forming an organic material layer by discharging an organic material in the third region, raising temperature of an edge area of the organic material layer, and forming an organic layer by hardening the organic material layer.

The display substrate may include a substrate, an organic encapsulation layer, and an inorganic encapsulation layer, wherein the organic encapsulation layer may include a first organic encapsulation region arranged in the first region and a second organic encapsulation region arranged in the second region and spaced apart from the first organic encapsulation region, wherein the inorganic encapsulation layer may cover the first organic encapsulation region and the second organic encapsulation region, and wherein the organic encapsulation material layer may be arranged between the first organic encapsulation region and the second organic encapsulation region, and may overlap an edge of the first organic encapsulation region and an edge of the second organic encapsulation region.

The raising of the temperature of the edge area of the organic material layer may include irradiating a laser beam to a heat transfer unit including a protrusion pin protruding toward the stage.

The protrusion pin may have a shape extending in a direction in which the third area extends.

The raising of the temperature of the edge area of the organic material layer may include moving the heat transfer unit to be close to the stage.

The method may further include configuring the protrusion pin to transfer heat to the organic material layer while being spaced apart from the stage.

The raising of the temperature of the edge area of the organic material layer may include irradiating a laser beam to the edge area of the organic material layer.

The raising of the temperature of the edge area of the organic material layer may include increasing a thickness of a central region of the organic material layer.

The forming of the organic layer may include reducing the thickness of the central region of the organic material layer.

The raising of the temperature of the edge area of the organic material layer may include reducing surface energy of the organic material layer.

BRIEF DESCRIPTION OF THE DRAWINGS

The above and other aspects and features of certain embodiments of the disclosure will be more apparent from the following description taken in conjunction with the accompanying drawings, in which.

DETAILED DESCRIPTION

Figure 1:
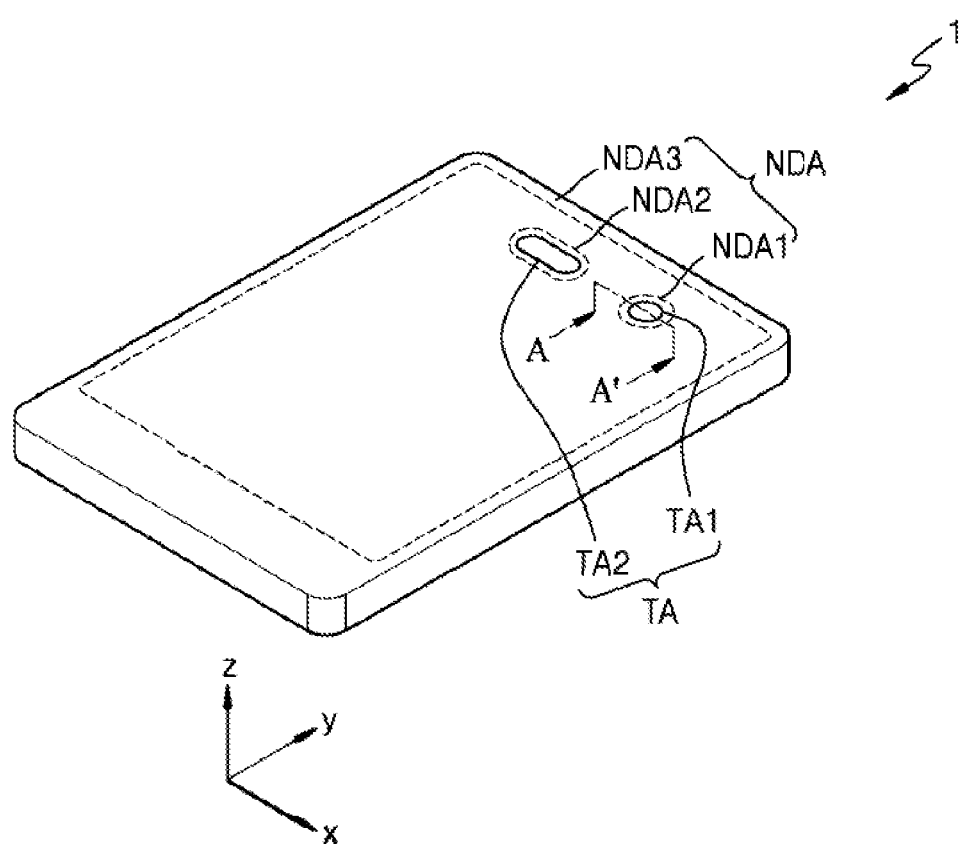
FIG. 1 is a perspective view of a display apparatus according to an embodiment.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of embodiments of the present disclosure. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, certain embodiments will be illustrated in the drawings and described in the written description. Effects and features of the disclosure, and methods for achieving them will be clarified with reference to embodiments described below in more detail with reference to the drawings. However, the disclosure is not limited to the following embodiments and may be embodied in various suitable forms.

Hereinafter, embodiments will be described with reference to the accompanying drawings, wherein like reference numerals refer to like elements throughout and a repeated description thereof will not be repeated.

While such terms as "first" and "second" may be used to describe various components, such components must not be limited to the above terms. The above terms are used to distinguish one component from another.

The singular forms "a," "an," and "the" as used herein are intended to include the plural forms as well unless the context clearly indicates otherwise.

It will be understood that the terms "comprise," "comprising," "include" and/or "including" as used herein specify the presence of stated features or components but do not preclude the addition of one or more other features or components.

It will be further understood that, when a layer, region, or component is referred to as being "on" another layer, region, or component, it can be directly or indirectly on the other layer, region, or component. For example, intervening layers, regions, or components may be present.

Sizes of elements in the drawings may be exaggerated or reduced for convenience of explanation. For example, because sizes and thicknesses of elements in the drawings are arbitrarily illustrated for convenience of explanation, the disclosure is not limited thereto.

In the case in which a certain embodiment may be implemented differently, a specific process order may be performed in the order different from the described order. As an example, two processes that are successively described may be substantially concurrently (e.g., simultaneously) performed or performed in the order opposite to the order described.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component or may be "indirectly electrically connected" to other layer, region, or component with other layer, region, or component interposed therebetween.

A display apparatus is an apparatus displaying images and may be included in portable electronic apparatuses such as game consoles, multimedia apparatuses, ultra-miniature personal computers (PCs). Display apparatuses may include liquid crystal displays, electrophoretic displays, organic light-emitting displays, inorganic light-emitting displays, field emission displays, surface-conduction electron-emitter displays, quantum dot displays, plasma displays, cathode ray displays, and the like. Hereinafter, though an organic light-emitting display apparatus is described as an example of a display apparatus according to an embodiment, the various suitable kinds of display apparatuses described above may be used in embodiments.

FIG. 1 is a perspective view of a display apparatus 1 according to an embodiment.

Referring to FIG. 1, the display apparatus 1 may include a display area DA, a non-display area NDA, and a transmission area TA. The display area DA may emit light. A plurality of pixels may be arranged in the display area DA. The display apparatus 1 may display a preset image by using light emitted from the plurality of pixels. The non-display area NDA may be configured not to emit light. The non-display area NDA may be adjacent to the display area DA.

The transmission area TA may be at least partially surrounded by the display area DA. In an embodiment, the transmission area TA may be surrounded by the display area DA entirely. In an embodiment, the transmission area TA may be provided in plurality (have plural transmission areas). For example, the transmission area TA may include a first transmission area TA1 and a second transmission area TA2. The first transmission area TA1 may be spaced apart from the second transmission area TA2. In another example, the transmission area TA may further include a third transmission area. In another embodiment, the transmission area TA may include one transmission area. Hereinafter, the embodiment in which the display apparatus 1 includes the first transmission area TA1 and the second transmission area TA2 is described in more detail.

The first transmission area TA1 may have a circular shape on a plane (e.g., an xy plane). The second transmission area TA2 may have a planar shape different from that of the first transmission area TA1. As an example, the length of the second transmission area TA2 in a first direction (e.g., an x direction or a −x direction) may be greater than the length of the first transmission area TA1 in the first direction (e.g., the x direction or the −x direction). The length of the second transmission area TA2 in a second direction (e.g., a y direction or a −y direction) may be substantially the same as the length of the first transmission area TA1 in the second direction (e.g., the y direction or the −y direction).

The non-display area NDA may be configured not to display images. The non-display area NDA may include a first non-display area NDA1, a second non-display area NDA2, and a third non-display area NDA3. The first non-display area NDA1 may surround the first transmission area TA1. The first non-display area NDA1 may be arranged between the first transmission area TA1 and the display area DA. The second non-display area NDA2 may surround the second transmission area TA2. The second non-display area NDA2 may be arranged between the second transmission area TA2 and the display area DA. The third non-display area NDA3 may at least partially surround the display area DA.

In an embodiment, the display area DA may surround the first non-display area NDA1 and the second non-display area NDA2. The third non-display area NDA3 may surround the display area DA entirely.

Figure 2:
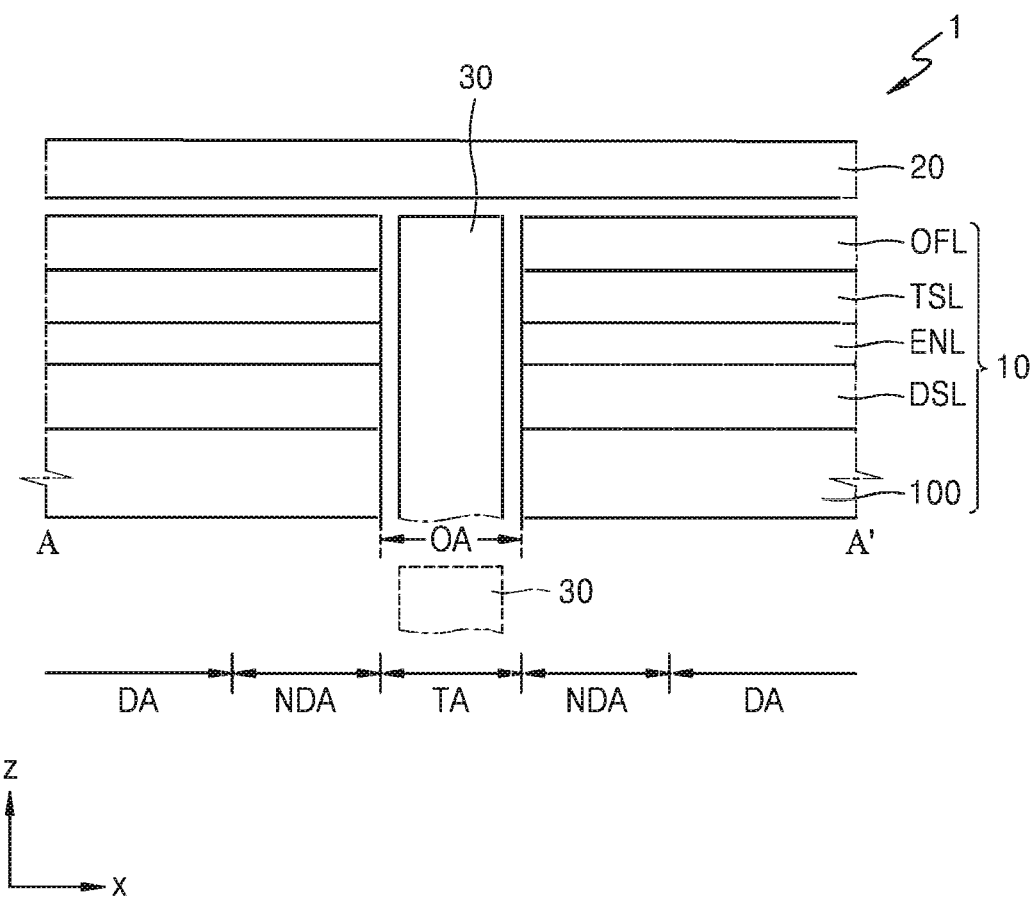
FIG. 2 is a cross-sectional view of the display apparatus of FIG. 1, taken along a line A-A'.

FIG. 2 is a cross-sectional view of the display apparatus 1 of FIG. 1, taken along a line A-A'.

Referring to FIG. 2, the display apparatus 1 may include a display panel 10, a cover window 20, and a component 30. The display panel 10 may be configured to display images. The display panel 10 may include a plurality of pixels arranged in the display area DA. The plurality of pixels may each include a display element and a pixel circuit connected (coupled) thereto. The display element may include an organic light-emitting diode, an inorganic light-emitting diode, or a quantum-dot light-emitting diode. Hereinafter, the embodiment in which the display element includes an organic light-emitting diode is described in more detail.

The display panel 10 may include a substrate 100 and a multi-layer on the substrate 100. In this embodiment, the display area DA, the non-display area NDA, and the transmission area TA may be defined in the substrate 100 and/or the multi-layer. As an example, the substrate 100 may include the display area DA, the non-display area NDA, and the transmission area TA. Hereinafter, the embodiment in which the display area DA, the non-display area NDA, and the transmission area TA are defined in the substrate 100 is described in more detail.

The substrate 100 may include glass or a polymer resin such as polyethersulfone, polyarylate, polyetherimide, polyethylene naphthalate, polyethylene terephthalate, polyphenylene sulfide, polyimide, polycarbonate, cellulose tri acetate, cellulose acetate propionate, and/or the like. In an embodiment, the substrate 100 may have a multi-layered structure including a base layer and a barrier layer each including the polymer resin. The substrate 100 including the polymer resin may be flexible, rollable, and bendable.

A display layer DSL may be arranged on the substrate 100. The display layer DSL may include a pixel circuit layer and a display element layer, the pixel circuit layer including a plurality of pixel circuits, and the display element layer including a plurality of display elements. In this embodiment, the plurality of pixel circuits may be respectively connected (coupled) to the plurality of display elements. The pixel circuit may include a thin-film transistor and/or a storage capacitor. In addition, the display layer DSL may further include an insulating layer therebetween.

An encapsulation layer ENL may be arranged on the display layer DSL. The encapsulation layer ENL may be arranged on the display element and may cover the display element. In an embodiment, the encapsulation layer ENL may include at least one inorganic encapsulation layer and at least one organic encapsulation layer. The at least one inorganic encapsulation layer may include at least one inorganic material among aluminum oxide ($Al_2O_3$), titanium oxide ($TiO_2$), tantalum oxide ($Ta_2O_5$), zinc oxide ($ZnO_x$), silicon oxide ($SiO_2$), silicon nitride ($SiN_x$), and silicon oxynitride (SiON). Zinc oxide ($ZnO_x$) may be zinc oxide (ZnO) and/or zinc peroxide ($ZnO_2$). At least one organic encapsulation layer may include a polymer-based material. The polymer-based material may include an acryl-based resin, an epoxy-based resin, polyimide, and/or polyethylene. In an embodiment, the at least one organic encapsulation layer may include acrylate.

A touch sensor layer TSL may be arranged on the encapsulation layer ENL. The touch sensor layer TSL may sense coordinate information corresponding to an external input, for example, a touch event. The touch sensor layer TSL may include a sensor electrode and touch wirings connected to the sensor electrode. The touch sensor layer TSL may sense an external input by using a self-capacitance method or a mutual capacitance method. The touch sensor layer TSL may be formed on the encapsulation layer ENL. In some embodiments, the touch sensor layer TSL may be separately formed on a touch substrate and then coupled to the encapsulation layer ENL through an adhesive layer such as an optically clear adhesive. In an embodiment, the touch sensor layer TSL may be formed directly on the encapsulation layer ENL. In this embodiment, an adhesive layer may not be arranged between the touch sensor layer TSL and the encapsulation layer ENL.

An optical functional layer OFL may be arranged on the touch sensor layer TSL. The optical functional layer OFL may reduce the reflectivity of light (external light) incident toward the display apparatus 1 from outside, and/or improve the color purity of light emitted from the display apparatus 1. In an embodiment, the optical functional layer OFL may include a retarder and a polarizer. The retarder may include a film-type retarder or a liquid crystal-type retarder. The retarder may include a λ/2 retarder and/or a λ/4 retarder. The polarizer may include a film-type polarizer or a liquid crystal-type polarizer. The film-type polarizer may include a stretchable synthetic resin film, and the liquid crystal-type polarizer may include liquid crystals arranged in a predetermined (set) arrangement. Each of the retarder and the polarizer may further include a protective film.

In another embodiment, the optical functional layer OFL may include a black matrix and color filters. The color filters may be arranged by considering colors of pieces of light emitted respectively from the pixels of the display apparatus 1. The color filters may each include red, green, or blue pigment or dye. In some embodiments, the color filters may each further include quantum dots in addition to the pigment or dye. In some embodiments, some of the color filters may not include the pigment or dye and may include scattering particles such as titanium oxide.

In another embodiment, the optical functional layer OFL may include a destructive interference structure. The destructive interference structure may include a first reflection layer and a second reflection layer respectively arranged on different layers. First-reflected light and second-reflected light respectively reflected by the first reflection layer and the second reflection layer may destructively interfere and thus the reflectivity of external light may be reduced.

The display panel 10 may include an opening area OA. In an embodiment, the substrate 100 of the display panel 10 may include a first opening, and the display layer DSL, the encapsulation layer ENL, the touch sensor layer TSL, and the optical functional layer OFL may respectively include second to fifth openings. The first to fifth openings may overlap one another to constitute the opening area OA of the display panel 10. In another embodiment, at least one of the substrate 100, the display layer DSL, the encapsulation layer ENL, the touch sensor layer TSL, and the optical functional layer OFL may not include an opening. As an example, one or two elements from among the substrate 100, the display layer DSL, the encapsulation layer ENL, the touch sensor layer TSL, and the optical functional layer OFL may not include an opening.

The cover window 20 may be arranged over the display panel 10. The cover window 20 may protect the display panel 10. The cover window 20 may include at least one of glass, sapphire, and plastic. The cover window 20 may include, for example, ultra-thin glass, or colorless polyimide.

The component 30 may be arranged in the transmission area TA. The component 30 may overlap the opening area OA. As shown in solid lines in FIG. 2, the component 30 may be arranged inside the opening area OA of the display panel 10, or as shown in dashed lines, the component 30 may be arranged below the opening area OA of the display panel 10.

The component 30 may include an electronic element. The component 30 may be an electronic element that uses light or sound. For example, the electronic element may include a sensor such as an infrared sensor that emits and/or receives light, a camera that receives light to capture an image, a sensor that outputs and senses light or sound to measure a distance or recognize a fingerprint, a small lamp that outputs light, and/or a speaker that outputs sound. The electronic element that uses light may use light in various suitable wavelength bands such as visible light, infrared light, or ultraviolet light. In an embodiment, the opening area OA of the display panel 10 may overlap the transmission area TA through which light and/or sound that is output from the component 30 to the outside or that progresses toward the electronic element from the outside may pass.

In another embodiment, in the case in which the display apparatus 1 is used as a smartwatch or an instrument panel for an automobile, the component 30 may be a member such as clock hands or a needle indicating predetermined (set) information (e.g., the velocity of a vehicle, etc.). In the embodiment in which the display apparatus 1 includes clock hands or an instrument panel for an automobile, the component 30 may be exposed to the outside by passing through the cover window 20. The cover window 20 may include an opening overlapping the opening area OA of the display panel 10.

The component 30 may include element(s) related to the function of the display panel 10 as described above, or may include an element such as an accessory that increases the aesthetic sense of the display panel 10.

Figure 3:
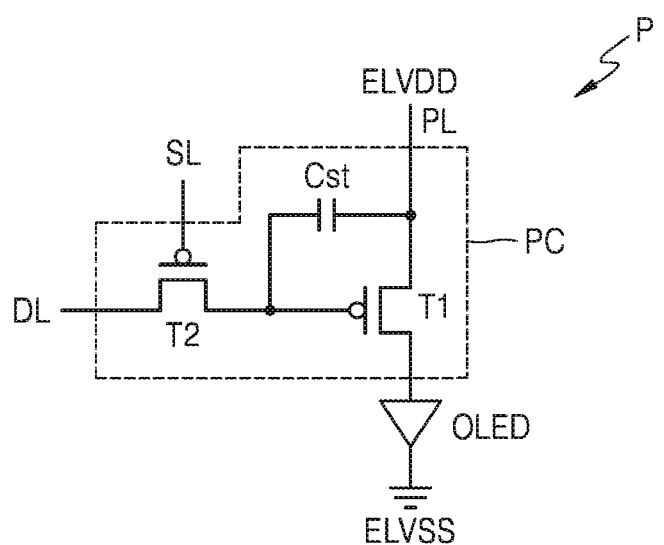
FIG. 3 is an equivalent circuit diagram of a pixel of a display panel.

FIG. 3 is an equivalent circuit diagram of a pixel P of the display panel 10.

Referring to FIG. 3, each pixel P may include a pixel circuit PC and an organic light-emitting diode OLED, which is a display element connected to the pixel circuit PC. The pixel circuit PC may include a driving thin-film transistor T1, a switching thin-film transistor T2, and a storage capacitor Cst. Each pixel P may emit red, green, blue, or white light from the organic light-emitting diode OLED.

The switching thin-film transistor T2 is connected to a scan line SL and a data line DL, and configured to transfer a data voltage or a data signal to the driving thin-film transistor T1 according to a switching voltage or a switching signal input from the scan line SL, the data voltage or the data signal being input from the data line DL.

The storage capacitor Cst may be connected to the switching thin-film transistor T2 and a driving voltage line PL and configured to store a voltage corresponding to a difference between a voltage transferred from the switching thin-film transistor T2 and a first power voltage ELVDD supplied to the driving voltage line PL.

The driving thin-film transistor T1 may be connected to the driving voltage line PL and the storage capacitor Cst and configured to control a driving current according to the voltage stored in the storage capacitor Cst, the driving current flowing from the driving voltage line PL to the organic light-emitting diode OLED.

The organic light-emitting diode OLED may emit light having a preset brightness corresponding to the driving current. A second electrode of the organic light-emitting diode OLED may receive a second power voltage ELVSS.

Although it is shown in FIG. 3 that the pixel circuit PC includes two thin-film transistors and one storage capacitor, the number of thin-film transistors and the number of storage capacitors may be variously suitably changed depending on the design of the pixel circuit PC.

Figure 4:
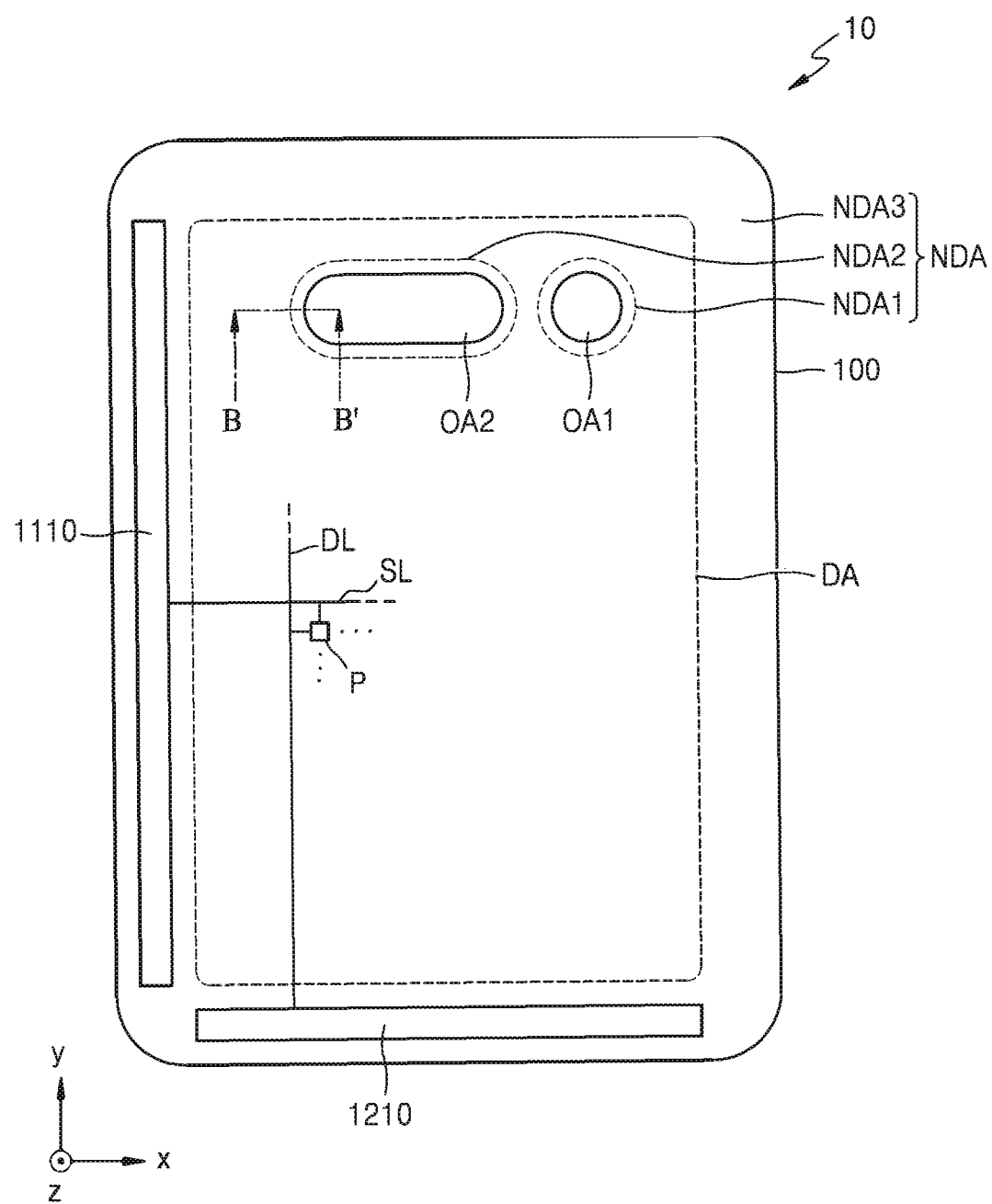
FIG. 4 is a plan view of a display panel according to an embodiment.

FIG. 4 is a plan view of the display panel 10 according to an embodiment.

Referring to FIG. 4, the display panel 10 may include the display area DA, the opening area OA, and the non-display area NDA. In this embodiment, the display area DA, the opening area OA, and the non-display area NDA may be defined in the substrate 100 of the display panel 10. For example, the substrate 100 may include the display area DA, the opening area OA, and the non-display area NDA.

The display area OA may surround the opening area OA. The display panel 10 may include the plurality of pixels arranged in the display area DA. In an embodiment, the pixel P may be connected to the scan line SL and the data line DL, the scan line SL extending in the first direction (e.g., the x direction or the −x direction), and the data line DL extending in the second direction (e.g., the y direction or the −y direction).

In an embodiment, the opening area OA may include a first opening area OA1 and a second opening area OA2. In an embodiment, the opening area OA may include more opening areas including the third opening area. In another embodiment, the opening area OA may include one opening area. Hereinafter, the embodiment in which the opening area OA includes the first opening area OA1 and the second opening area OA2 is described in more detail.

Although it is shown in FIG. 4 that the opening area OA is arranged on the upper side of the display area DA, the opening area OA may be arranged on the center, the left side, the lower side, or the right side of the display area DA.

The first opening area OA1 may have a circular shape on a plane (e.g., the xy plane). In an embodiment, the shape of the second opening area OA2 on a plane (e.g., the xy plane) may be different from the shape of the first opening area OA1 on a plane (e.g., the xy plane). For example, the width of the first opening area OA1 in the first direction (e.g., the x direction or the −x direction) may be less than the width of the second opening area OA2 in the first direction (e.g., the x direction or the −x direction). The width of the first opening area OA1 in the second direction (e.g., the y direction or the −y direction) may be substantially the same as the width of the second opening area OA2 in the second direction (e.g., the y direction or the −y direction). A portion of the edge of the second opening area OA2 may have a curved shape, and another portion of the edge of the second opening area OA2 may have a straight-line shape. For example, the second opening area OA2 may include a first edge, a second edge, a third edge, and a fourth edge, the first edge and the second edge being spaced apart from each other in the second direction (e.g., the y direction or the −y direction) and extending in the first direction (e.g., the x direction or the −x direction), the third edge connecting one side of the first edge to one side of the second edge in a semicircular shape, and the fourth edge connecting another side of the first edge to another side of the second edge in a semicircular shape.

The non-display area NDA may include the first non-display area NDA1, the second non-display area NDA2, and the third non-display area NDA3. The first non-display area NDA1 may be arranged between the first opening area OA1 and the display area DA. The first non-display area NDA1 may surround the first opening area OA1. The second non-display area NDA2 may be arranged between the second opening area OA2 and the display area DA. The second non-display area NDA2 may surround the second opening area OA2. A scan driver 1110, a data driver 1210, a main power wiring, and the like may be arranged in the third non-display area NDA3, the scan driver 1110 providing a scan signal to each pixel P, the data driver 1210 providing a data signal to each pixel P, and the main power wiring providing a first power voltage and/or a second power voltage. Although it is shown in FIG. 4 that the data driver 1210 is adjacent to one side of the substrate 100, the data driver 1210 may be arranged on a printed circuit board electrically connected to a pad arranged on one side of the display panel 10 in another embodiment.

Figure 5:
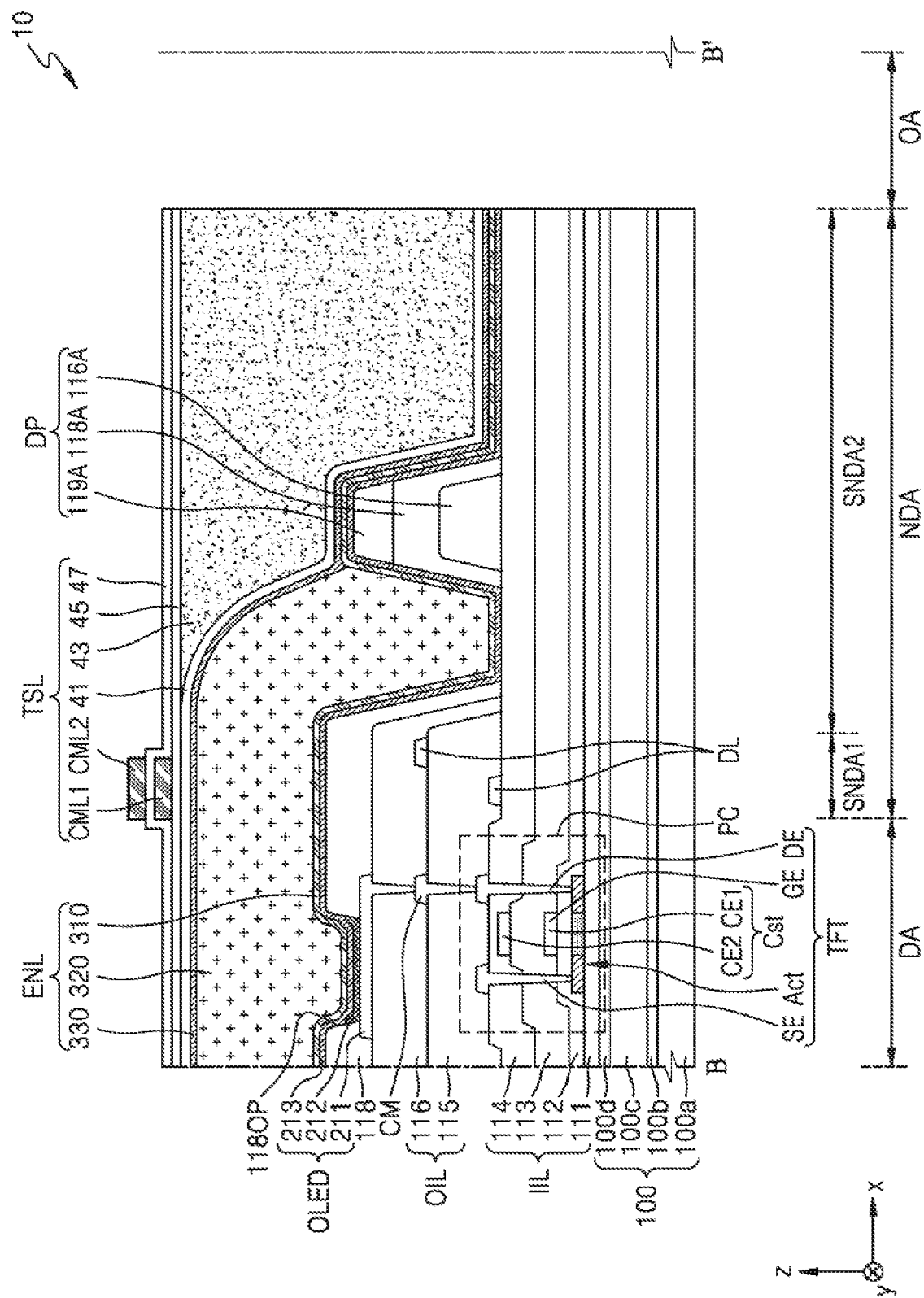
FIG. 5 is a cross-sectional view of the display panel of FIG. 4, taken along a line B-B'.

FIG. 5 is a cross-sectional view of the display panel 10 of FIG. 4, taken along a line B-B'.

Referring to FIG. 5, the display panel 10 may include the substrate 100, the display layer, the encapsulation layer ENL, and the touch sensor layer TSL. The substrate 100 may include the display area DA, the opening area OA, and the non-display area NDA. The non-display area NDA may be arranged between the display area DA and the opening area OA.

The substrate 100 may include a first base layer 100a, a first barrier layer 100b, a second base layer 100c, and a second barrier layer 100d. In an embodiment, the first base layer 100a, the first barrier layer 100b, the second base layer 100c, and the second barrier layer 100d may be sequentially stacked. In an embodiment, the first base layer 100a, the first barrier layer 100b, the second base layer 100c, and the second barrier layer 100d may be successively arranged. For example, the first base layer 100a, the first barrier layer 100b, the second base layer 100c, and the second barrier layer 100d may be successively arranged in a direction from the display area DA to the opening area OA.

At least one of the first base layer 100a and the second base layer 100c may include a polymer resin such as polyethersulfone, polyarylate, polyetherimide, polyethylene naphthalate, polyethylene terephthalate, polyphenylene sulfide, polyimide, polycarbonate, cellulose tri acetate, cellulose acetate propionate, and/or the like.

The first barrier layer 100b and the second barrier layer 100d are barrier layers preventing (reducing) the penetration of external foreign materials and may include a single layer or a multi-layer including an inorganic material such as silicon oxide ($SiO_2$), silicon nitride ($SiN_x$), and/or silicon oxynitride (SiON).

The display layer may be arranged on the substrate 100. The display layer may include an inorganic insulating layer IIL, an organic insulating layer OIL, the pixel circuit PC, the data line DL, a connection electrode CM, the organic light-emitting diode OLED, a pixel-defining layer 118, and a dam portion DP.

The inorganic insulating layer IIL may be arranged on the substrate 100. The inorganic insulating layer IIL may include a buffer layer 111, a first gate insulating layer 112, a second gate insulating layer 113, and an interlayer insulating layer 114. The pixel circuit PC may be arranged in the display area DA. The pixel circuit PC may include a thin-film transistor TFT and a storage capacitor Cst.

The buffer layer 111 may be arranged on the substrate 100. The buffer layer 111 may include an inorganic insulating material such as silicon nitride ($SiN_x$), silicon oxynitride (SiON), and silicon oxide ($SiO_2$), and a single layer or a multi-layer including the inorganic insulating materials.

The thin-film transistor TFT may include a semiconductor layer Act, a gate electrode GE, a source electrode SE, and a drain electrode DE. The semiconductor layer Act may be arranged on the buffer layer 111. The semiconductor layer Act may include polycrystalline silicon. In some embodiments, the semiconductor layer Act may include amorphous silicon, an oxide semiconductor, or an organic semiconductor. The semiconductor layer Act may include a channel region, a drain region, and a source region, the drain region and the source region being on two opposite sides of the channel region.

The gate electrode GE may overlap the channel region. The gate electrode GE may include a low-resistance metal material. The gate electrode GE may include a conductive material including molybdenum (Mo), aluminum (Al), copper (Cu), and titanium (Ti) and have a single-layered structure or a multi-layered structure including the above materials.

The first gate insulating layer 112 between the semiconductor layer Act and the gate electrode GE may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_x$).

The second gate insulating layer 113 may cover the gate electrode GE. Similar to the first gate insulating layer 112, the second gate insulating layer 113 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_x$).

An upper electrode CE2 of the storage capacitor Cst may be arranged on the second gate insulating layer 113. The upper electrode CE2 may overlap the gate electrode GE. In this embodiment, the gate electrode GE and the upper electrode CE2 overlapping each other with the second gate insulating layer 113 therebetween may constitute the storage capacitor Cst. For example, the gate electrode GE may serve as a lower electrode CE1 of the storage capacitor Cst. As described above, the storage capacitor Cst may overlap the thin-film transistor TFT. In an embodiment, the storage capacitor Cst may not overlap the thin-film transistor TFT. The upper electrode CE2 may include aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu), and a single layer or a multi-layer including the above materials.

The interlayer insulating layer 114 may cover the upper electrode CE2. The interlayer insulating layer 114 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_x$). The interlayer insulating layer 114 may include a single layer or a multi-layer including the inorganic insulating material.

The drain electrode DE and the source electrode SE may each be arranged on the interlayer insulating layer 114. The drain electrode DE and the source electrode SE may each be connected to the semiconductor layer Act through a contact hole in the first gate insulating layer 112, the second gate insulating layer 113, and the interlayer insulating layer 114. The drain electrode DE and the source electrode SE may each include a material having high conductivity. The drain electrode DE and the source electrode SE may each include a conductive material including molybdenum (Mo), aluminum (Al), copper (Cu), and titanium (Ti) and have a single-layered structure or a multi-layered structure including the above materials. In an embodiment, the drain electrode DE and the source electrode SE may each have a multi-layered structure of Ti/Al/Ti.

The organic insulating layer OIL may be arranged on the inorganic insulating layer IIL. The organic insulating layer OIL may include a first organic insulating layer 115 and a second organic insulating layer 116. The first organic insulating layer 115 may cover the drain electrode DE and the source electrode SE. The first organic insulating layer 115 may include an organic insulating material such as a general-purpose polymer such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, and/or a blend thereof.

The connection electrode CM may be arranged on the first organic insulating layer 115. In this embodiment, the connection electrode CM may be connected to the pixel circuit PC through a contact hole of the first organic insulating layer 115. In an embodiment, the connection electrode CM may be connected to the drain electrode DE or the source electrode SE. The connection electrode CM may include a material having high conductivity. The connection electrode CM may include a conductive material including molybdenum (Mo), aluminum (Al), copper (Cu), and titanium (Ti) and have a single-layered structure or a multi-layered structure including the above materials. In an embodiment, the connection electrode CM may have a multi-layered structure of Ti/Al/Ti.

The second organic insulating layer 116 may cover the connection electrode CM. The second organic insulating layer 116 may include an organic insulating material including a general-purpose polymer such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, and/or a blend thereof.

The organic light-emitting diode OLED may be arranged on the second organic insulating layer 116. The organic light-emitting diode OLED may emit red, green, or blue light, or emit red, green, blue, or white light. The organic light-emitting diode OLED may include a first electrode 211, an emission layer 212, and a second electrode 213. The first electrode 211 may be a pixel electrode of the organic light-emitting diode OLED, and the second electrode 213 may be an opposite electrode of the organic light-emitting diode OLED.

The first electrode 211 may be arranged on the second organic insulating layer 116. The first electrode 211 may be electrically connected to the connection electrode CM through a contact hole of the second organic insulating layer 116. The first electrode 211 may include a conductive oxide such as indium tin oxide (ITO), indium zinc oxide (IZO), ZnO, indium oxide ($In_2O_3$), indium gallium oxide (IGO), and/or aluminum zinc oxide (AZO). In another embodiment, the first electrode 211 may include a reflective layer including silver (Ag), magnesium (Mg), aluminum (Al), platinum (Pt), palladium (Pd), gold (Au), nickel (Ni), neodymium (Nd), iridium (Ir), chrome (Cr), and/or a compound thereof. In another embodiment, the first electrode 211 may further include a layer on/under the reflective layer, the layer including ITO, IZO, ZnO, or $In_2O_3$. For example, the first electrode 211 may have a multi-layered structure of ITO/Ag/ITO.

The pixel-defining layer 118 may be arranged on the first electrode 211, the pixel-defining layer 118 including an opening 1180P exposing the central portion of the first electrode 211. The pixel-defining layer 118 may include an organic insulating material and/or an inorganic insulating material. The opening of the pixel-defining layer 118 may define an emission area of light emitted from the organic light-emitting diode OLED. For example, the width of the opening 1180P may correspond to the width of the emission area. In an embodiment, a spacer may be arranged on the pixel-defining layer 118.

The emission layer 212 may be arranged in the opening 1180P of the pixel-defining layer 118. The emission layer 212 may include a polymer organic material or a low molecular weight organic material emitting light having a preset color. In an embodiment, a first functional layer may be arranged between the first electrode 211 and the emission layer 212. The first functional layer may include, for example, a hole transport layer (HTL), or include an HTL and a hole injection layer (HIL). In an embodiment, a second functional layer may be arranged between the emission layer 212 and the second electrode 213. The second functional layer may include an electron transport layer (ETL) and/or an electron injection layer (EIL).

The second electrode 213 may include a conductive material having a low work function. For example, the second electrode 213 may include a (semi) transparent layer including silver (Ag), magnesium (Mg), aluminum (Al), platinum (Pt), palladium (Pd), gold (Au), nickel (Ni), neodymium (Nd), iridium (Ir), chrome (Cr), and/or an alloy thereof. In some embodiments, the second electrode 213 may further include a layer on the (semi) transparent layer, the layer including ITO, IZO, ZnO, and/or $In_2O_3$.

The non-display area NDA arranged between the display area DA and the opening area OA may include a first sub non-display area SNDA1 and a second sub non-display area SNDA2. The second sub non-display area SNDA2 may be arranged between the first sub non-display area SNDA1 and the opening area OA.

Signal lines, for example, the data line DL described with reference to FIG. 3, may be arranged in the first sub non-display area SNDA1. In an embodiment, the data line DL may be arranged between the inorganic insulating layer IIL and the first organic insulating layer 115 and/or between the first organic insulating layer 115 and the second organic insulating layer 116. In the embodiment in which the data lines DL are arranged on different layers as described above, the width of the first non-display area NDA1 may be reduced. Although it is shown in FIG. 5 that the data line DL is arranged in the first sub non-display area SNDA1, the scan line described with reference to FIG. 3 may be also arranged in first sub non-display area SNDA1.

The dam portion DP may be arranged in the second sub non-display area SNDA2. In an embodiment, the dam portion DP may be arranged on the inorganic insulating layer IIL. In another embodiment, the dam portion DP may be arranged on the substrate 100.

In an embodiment, the dam portion DP may include an organic pattern layer 116A, a first upper organic pattern layer 118A, and a second upper organic pattern layer 119A. The organic pattern layer 116A may be separated from the first organic insulating layer 115 and the second organic insulating layer 116. In an embodiment, the organic pattern layer 116A may include the same material as that of the second organic insulating layer 116. In another embodiment, the organic pattern layer 116A may include the same material as that of the first organic insulating layer 115. In another embodiment, the organic pattern layer 116A may include a first organic pattern layer and a second organic pattern layer on the first organic pattern layer. In this embodiment, the first organic pattern layer may include the same material as that of the first organic insulating layer 115. The second organic pattern layer may include the same material as that of the second organic insulating layer 116.

The first upper organic pattern layer 118A may be arranged on the organic pattern layer 116A. The first upper organic pattern layer 118A may be separated from the pixel-defining layer 118. The first upper organic pattern layer 118A may include the same materials as that of the pixel-defining layer 118.

The second upper organic pattern layer 119A may be arranged on the first upper organic pattern layer 118A. The second upper organic pattern layer 119A may include an organic material and/or an inorganic material.

The encapsulation layer ENL may be arranged on the display layer DSL. In an embodiment, the encapsulation layer ENL may cover the organic light-emitting diode OLED. The encapsulation layer ENL may include at least one inorganic encapsulation layer and at least one organic encapsulation layer. It is shown in FIG. 5 that the encapsulation layer ENL includes a first inorganic encapsulation layer 310, an organic encapsulation layer 320, and a second inorganic encapsulation layer 330.

The first inorganic encapsulation layer 310 and the second inorganic encapsulation layer 330 may extend from the display area DA to the first non-display area NDA1. The first inorganic encapsulation layer 310 and the second inorganic encapsulation layer 330 may be arranged in the non-display area NDA entirely and continuously. The first inorganic encapsulation layer 310 and the second inorganic encapsulation layer 330 may extend to the dam portion DP and contact each other on the upper surface of the dam portion DP.

The organic encapsulation layer 320 may extend from the display area DA to the dam portion DP. The organic encapsulation layer 320 may be formed by coating monomer and hardening the same. The flow of the monomer may be controlled by the dam portion DP. For example, the edge of the organic encapsulation layer 320 may be arranged on one side of the dam portion DP.

The touch sensor layer TSL may be arranged on the encapsulation layer ENL. The touch sensor layer TSL may include a first insulating layer 41, an organic layer 43, a second insulating layer 45, a first conductive layer CML1, a third insulating layer 47, and a second conductive layer CML2.

The first insulating layer 41 may be arranged on the second inorganic encapsulation layer. In an embodiment, the first insulating layer 41 may be arranged along the shape of the second inorganic encapsulation layer 330. In an embodiment, the first insulating layer 41 may be omitted.

The organic layer 43 may be arranged on the first insulating layer 41. In an embodiment, the organic layer 43 may be arranged on the second inorganic encapsulation layer 330. The organic layer 43 may be arranged on the second sub non-display area SNDA2. The upper surface of the organic layer 43 may be flat. The organic layer 43 may have a closed-curved shape (e.g., a doughnut shape) surrounding the opening area OA. One side of the organic layer 43 may face the opening area OA, and another side of the organic layer 43 may face the display area DA. In an embodiment, a portion of the organic layer 43 may overlap the edge of the organic encapsulation layer 320. A stack structure of the display panel 10 in the non-display area NDA may have bending or curved shape below the organic layer 43. The organic layer 43 may planarize the stack structure of the display panel 10. A method of forming the organic layer 43 is described below.

The second insulating layer 45 may be arranged on the first insulating layer 41 and the organic layer 43. The second insulating layer 45 may be arranged on the upper surface of the organic layer 43 that is flat. The first insulating layer 41 and the second insulating layer 45 may each be a single layer or a multi-layer including an inorganic material such as silicon nitride ($SiN_x$), silicon oxide ($SiO_2$), and/or silicon oxynitride (SiON).

The organic layer 43 may include an organic material. The organic layer 43 may include a polymer-based material. The polymer-based material may be transparent. For example, the organic layer 43 may include a silicon-based resin, an acryl-based resin, an epoxy-based resin, polyimide, and/or polyethylene.

The first conductive layer CML1 and the second conductive layer CML2 may each include a conductive material, for example, metal. For example, the first conductive layer CML1 and the second conductive layer CML2 may each include at least one of molybdenum (Mo), aluminum (Al), copper (Cu), and titanium (Ti) and have a single-layered structure or a multi-layered structure including the above materials. In an embodiment, the first conductive layer CML1 and the second conductive layer CML2 may each have a structure of Ti/Al/Ti in which a titanium layer, an aluminum layer, and a titanium layer are sequentially stacked.

The first conductive layer CML1 and/or the second conductive layer CML2 may include a plurality of touch electrodes configured to detect a touch input. In an embodiment, the touch sensor layer TSL may include touch electrodes extending in the first direction (e.g., the x direction or the −x direction), and touch electrodes extending in the second direction (e.g., the y direction or the −y direction). The touch electrodes may sense an input by using a mutual capacitance method and be provided to the first conductive layer CML1 and/or the second conductive layer CML2. In another embodiment, the touch electrode may sense an input by using a mutual capacitance method and may be provided to the first conductive layer CML1 and/or the second conductive layer CML2.

A third insulating layer 47 may be arranged between the first conductive layer CML1 and the second conductive layer CML2. The third insulating layer 47 may be a single layer or a multi-layer including an inorganic material such as silicon nitride ($SiN_x$), silicon oxide ($SiO_2$), and/or silicon oxynitride (SiON).

Although it is shown in FIG. 5 that the touch sensor layer TSL includes the first conductive layer CML1 and the second conductive layer CML2, in another embodiment, the touch sensor layer TSL may include one of the first conductive layer CML1 and the second conductive layer CML2. Although it is described in FIG. 5 that the organic layer 43 is a layer included in the touch sensor layer TSL, in another embodiment, the organic layer 43 may be an independent layer configured to planarize the stack structure of the display panel 10.

Figure 6:
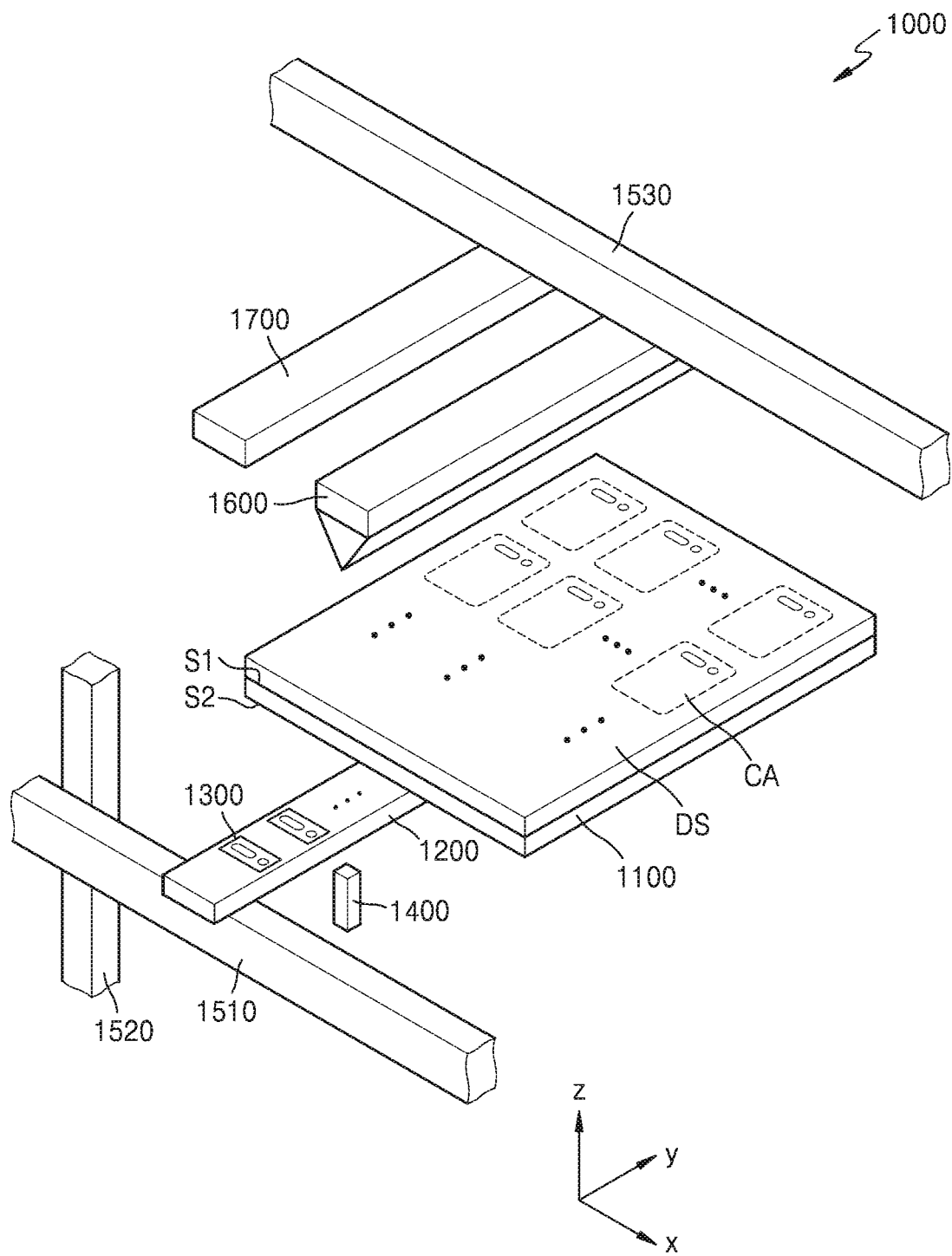
FIG. 6 is a perspective view of an apparatus for manufacturing a display apparatus, according to an embodiment.

FIG. 6 is a perspective view of an apparatus 1000 for manufacturing a display apparatus according to an embodiment.

Referring to FIG. 6, the apparatus 1000 for manufacturing a display apparatus may include a stage 1100, a jig 1200, a heat transfer unit 1300, a laser unit 1400, a first guide 1510, a second guide 1520, a third guide 1530, an organic material discharger 1600, and an ultraviolet irradiator 1700.

The stage 1100 may include a first surface S1 and a second surface S2. The first surface S1 may be arranged on a display substrate DS. The second surface S2 may be opposite to the first surface S1.

The display substrate DS may be a display apparatus or a display panel being manufactured. In an embodiment, the display substrate DS may include a plurality of cell areas CA. The plurality of cell areas CA may each be a display apparatus or a display panel being manufactured. The plurality of cell areas CA may be arranged in the first direction (e.g., the x direction or the −x direction) and/or in the second direction (e.g., the y direction or the −y direction). In another embodiment, the display substrate DS may include one cell area CA. Hereinafter, the embodiment in which the display substrate DS includes the plurality of cell areas CA is described in more detail.

The jig 1200 may be arranged under the stage 1100. In an embodiment, the jig 1200 may face the second surface S2. In an embodiment, the jig 1200 may have a bar shape. The jig 1200 may extend in the second direction (e.g., the y direction or the −y direction). In an embodiment, the jig 1200 may be configured to move in the first direction (e.g., the x direction or the −x direction) automatically or manually. In an embodiment, the jig 1200 may be configured to move in the third direction (e.g., a z direction or a −z direction) automatically or manually.

The heat transfer unit 1300 may be arranged on the jig 1200. In an embodiment, plural heat transfer units 1300 may be provided. The plurality of heat transfer units 1300 may be arranged on the jig 1200. In an embodiment, the plurality of heat transfer units 1300 may be arranged in the second direction (e.g., they direction or the −y direction). The heat transfer unit 1300 may include a protrusion protruding toward the second surface S2. In an embodiment, the heat transfer unit 1300 may be omitted.

The laser unit 1400 may irradiate a laser to the heat transfer unit 1300. In an embodiment, the laser unit 1400 may be an infrared laser unit. In this embodiment, the laser unit 1400 may irradiate an infrared ray. In an embodiment, plural laser units 1400 may be provided. In an embodiment, a laser wavelength, a pulse duration, laser power, and/or the like of the laser unit 1400 may be adjusted.

The first guide 1510 may be configured to guide the jig 1200 to move in the first direction (e.g., the x direction or the −x direction). The first guide 1510 may align the jig 1200 with the stage 1100. In an embodiment, the first guide 1510 may include a first linear motion rail and a first linear motion block, the first linear motion rail extending in the first direction (e.g., the x direction or the −x direction), and the first linear motion block moving along the first linear motion rail. The first linear motion block may be configured to move the first linear motion rail. For example, the jig 1200 may be arranged on the first linear motion block and may move in the first direction (e.g., the x direction or the −x direction).

The second guide 1520 may be configured to guide the first guide 1510 to move in the third direction (e.g., the z direction or the −z direction). In an embodiment, the second guide 1520 may include a second linear motion rail and a second linear motion block, the second linear motion rail extending in the third direction (e.g., the z direction or the −z direction), and the second linear motion block moving along the second linear motion rail. The second linear motion block may be configured to move the second linear motion rail. For example, the first guide 1510 may be arranged on the second linear motion block and may move in the third direction (e.g., the z direction or the −z direction). Accordingly, the jig 1200 may be configured to move in one of a direction (e.g., the z direction) closer to the stage 1100 and a direction (e.g., the −z direction) away from the stage 1100. For example, the second guide 1520 may be configured to guide the jig 1200 to move in one of a direction (e.g., the z direction) closer to the stage 1100 and a direction (e.g., the −z direction) away from the stage 1100.

The third guide 1530 may be configured to guide to move the organic material discharger 1600 and the ultraviolet irradiator 1700 in the first direction (e.g., the x direction or the −x direction). In an embodiment, the third guide 1530 may include a third linear motion rail, a third linear motion block, and a fourth linear motion rail, the third linear motion rail extending in the first direction (e.g., the x direction or the −x direction), and the third linear motion block and the fourth linear motion block each moving along the third linear motion rail. The third linear motion block and the fourth linear motion block may be configured to move along the third linear motion rail. For example, the organic material discharger 1600 may be arranged on the third linear motion block and may move in the first direction (e.g., the x direction or the −x direction). As an example, the ultraviolet irradiator 1700 may be arranged on the fourth linear motion block and may move in the first direction (e.g., the x direction or the −x direction). In an embodiment, the third guide 1530 may further include a fourth linear motion rail. In this embodiment, the fourth linear motion block may move along the fourth linear motion rail, and organic material discharger 1600 and the ultraviolet irradiator 1700 may each move along an independent linear motion rail.

The organic material discharger 1600 may discharge an organic material on the display substrate DS. In an embodiment, the organic material discharger 1600 may include an inkjet head and discharge an organic material by using inkjet printing or other methods that should be apparent to one of ordinary skill in the art upon reviewing the present disclosure. The organic material discharger 1600 may extend in the second direction (e.g., the y direction or the −y direction). The organic material discharger 1600 may include a plurality of dischargers. In an embodiment, the organic material discharger 1600 may be configured to move in the first direction (e.g., the x direction or the −x direction) automatically or manually.

The ultraviolet irradiator 1700 may irradiate an ultraviolet toward discharged organic materials. Accordingly, the organic materials may be hardened. The ultraviolet irradiator 1700 may include an ultraviolet (UV) lamp. The ultraviolet irradiator 1700 may extend in the second direction (e.g., the y direction or the −y direction). The ultraviolet irradiator 1700 may be configured to move in the first direction (e.g., the x direction or the −x direction) automatically or manually.

In an embodiment, the apparatus 1000 for manufacturing the display apparatus may further include a chamber. Inside the chamber, the stage 1100, the jig 1200, the heat transfer unit 1300, the laser unit 1400, the first guide 1510, the second guide 1520, the third guide 1530, the organic material discharger 1600, and the ultraviolet irradiator 1700 may be arranged.

Figure 7:
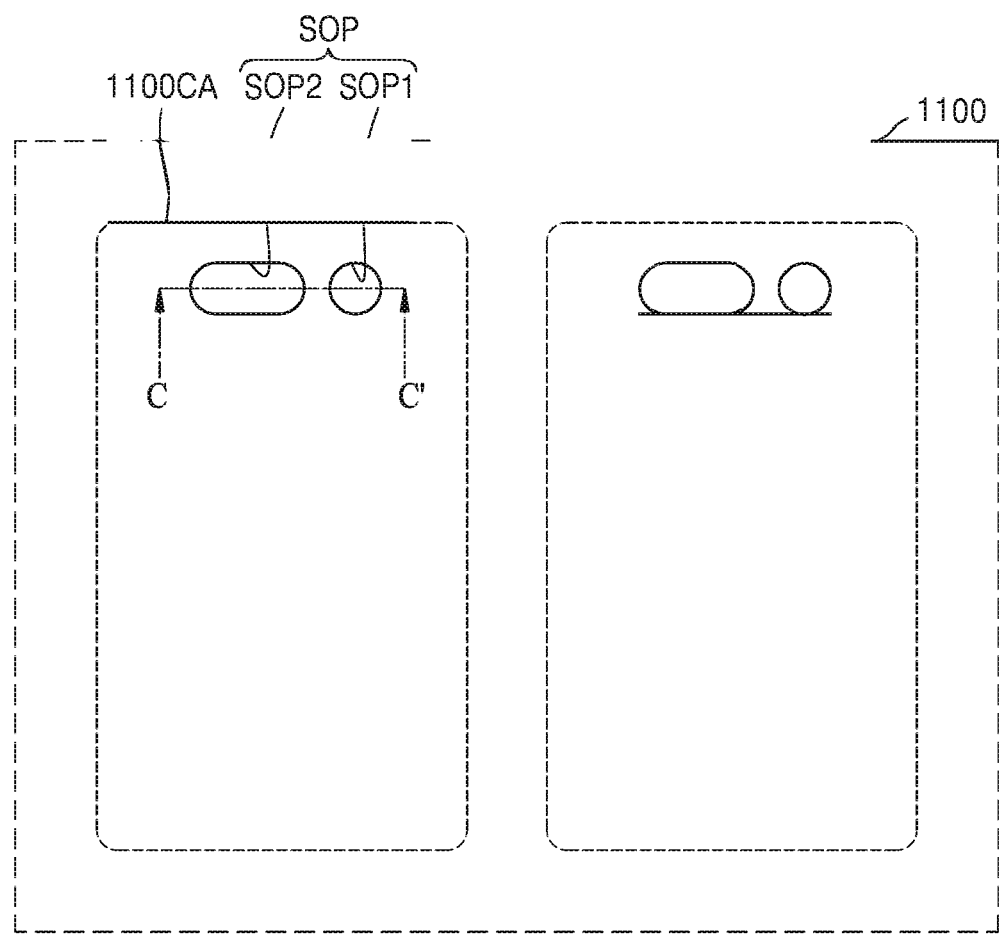
FIG. 7 is a plan view of a portion of a stage according to an embodiment.

FIG. 7 is a plan view of a portion of the stage 1100 according to an embodiment.

Referring to FIG. 7, the stage 1100 may include a stage cell area CA. The stage cell area 1100CA may be a region in which the cell area of the display substrate DS is arranged. In an embodiment, plural stage cell areas 1100CA may be provided. The plurality of stage cell area 1100CA may be arranged in the first direction (e.g., the x direction or the −x direction) and/or in the second direction (e.g., the y direction or the −y direction).

The stage 1100 may include a stage opening SOP overlapping the stage cell area 1100CA. The stage opening SOP may pass through to overlap a region in which the display substrate DS is arranged. In an embodiment, the stage opening SOP may include a first stage opening SOP1 and a second stage opening SOP2. The first stage opening SOP1 may have a shape substantially the same as or similar to the first opening area OA1 of FIG. 4. The second stage opening SOP2 may have a shape substantially the same as or similar to the second opening area OA2 of FIG. 4. The stage opening SOP may be a portion for the laser unit 1400 of FIG. 6 to directly irradiate a laser toward the display substrate DS. In an embodiment, the stage opening SOP may be omitted.

Figure 8A:
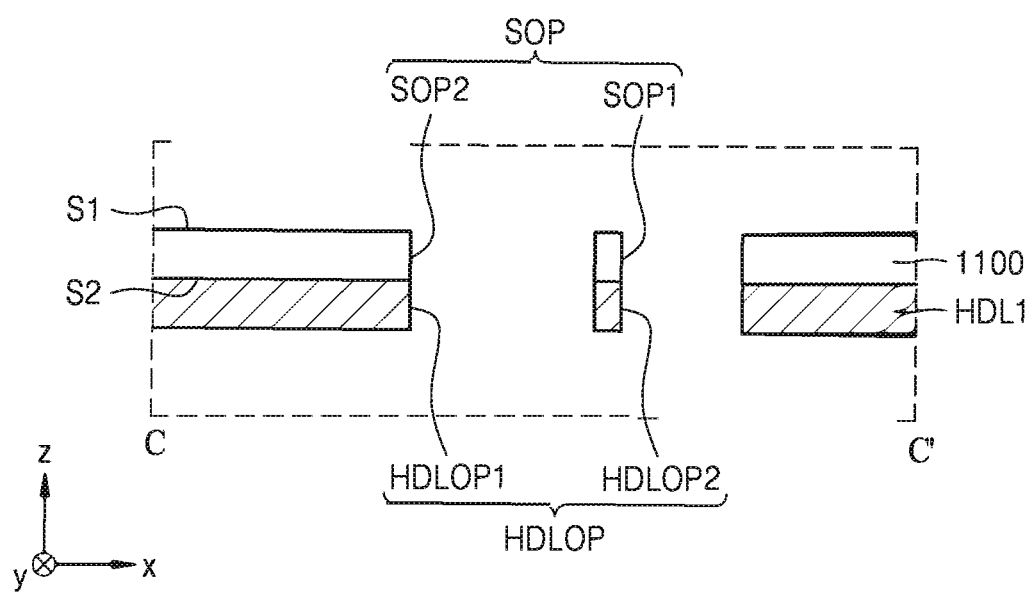
FIGS. 8A-8C are cross-sectional views of the stage, taken along a line C-C' of FIG. 7, according to embodiments.
Figure 8B:
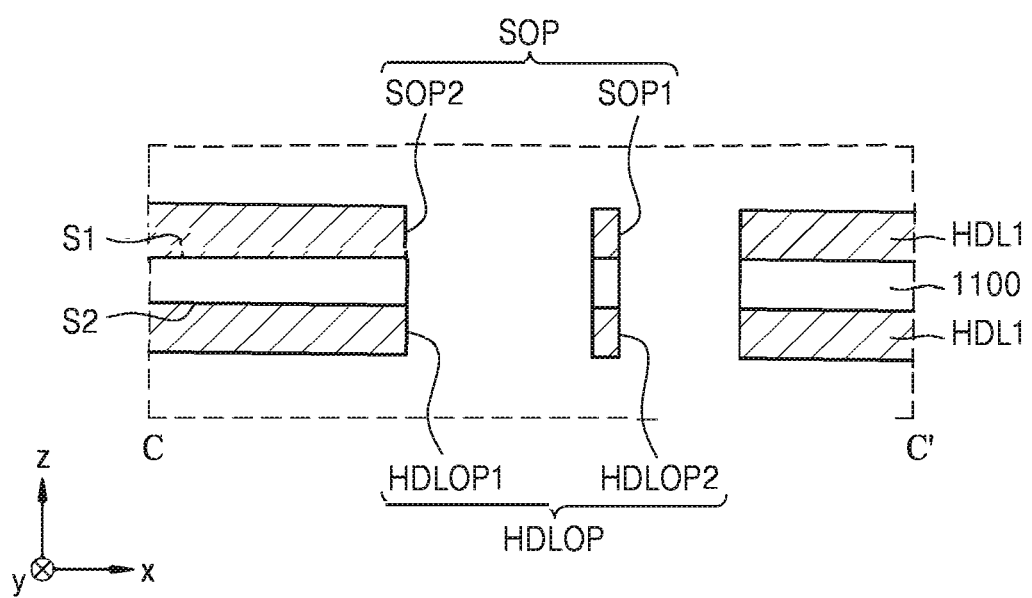
Figure 8C:
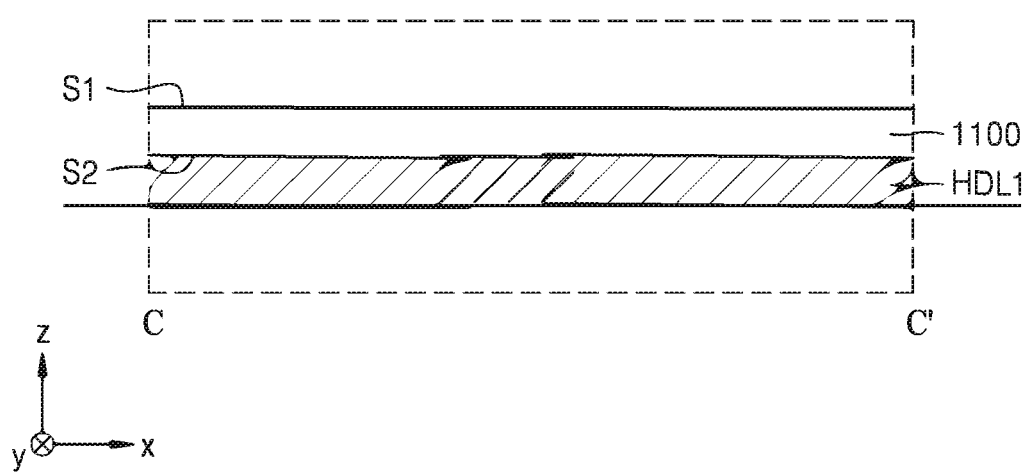

FIGS. 8A to 8C are cross-sectional views of the stage 1100, taken along line C-C' of FIG. 7 according to embodiments.

Referring to FIGS. 8A to 8C, the stage 1100 may include the first stage S1 and the second stage S2. The apparatus for manufacturing a display apparatus may further include a first heat-dissipating layer HDL1 arranged on one of the first surface S1 and the second surface S2 of the stage 1100.

The first heat-dissipating layer HDL1 may include a heat-dissipating layer opening HDLOP overlapping the stage opening SOP. In an embodiment, the heat-dissipating layer HDLOP may include a first heat-dissipating layer opening HDLOP1 and a second heat-dissipating layer opening HDLOP2. The first heat-dissipating layer opening HDLOP1 may overlap the first stage opening SOP1. The second heat-dissipating layer opening HDLOP2 may overlap the second stage opening SOP2.

In an embodiment, the first heat-dissipating layer HDL1 may include a carbon structure such as carbon nanotubes (CNTs), graphene, graphite, or the like. In an embodiment, the first heat-dissipating layer HDL1 may include a matrix based on silicon including particles, aluminum nitride (AlN), ZnO, and grease such as silicon oil and/or the like. In an embodiment, the first heat-dissipating layer HDL1 may include a phase change material (PCM) such as polyolefin, epoxy, low-molecular-weight polyesters, acryl, and/or the like. In an embodiment, the first heat-dissipating layer HDL1 may include gels such as silicone including aluminum (Al), aluminum oxide ($Al_2O_3$), and silver (Ag) particles, and/or an olefin matrix. In an embodiment, the first heat-dissipating layer HDL1 may include silver (Ag) particles and hardened epoxy. In an embodiment, the first heat-dissipating layer HDL1 may include metal or solder, the metal including at least one of indium (In), silver (Ag), tin (Sn), copper (Cu), and bismuth (Bi).

Referring to FIG. 8A, the first heat-dissipating layer HDL1 may be arranged on the second surface S2 of the stage 1100. Accordingly, the first heat-dissipating layer HDL1 may dissipate heat in the −z direction of the stage 1100 and prevent or reduce the damage of the display substrate DS.

Referring to FIG. 8B, the first heat-dissipating layer HDL1 may be arranged on the first surface S1 and the second surface S2. The first heat-dissipating layer HDL1 arranged on the first surface 51 may conduct heat from the display substrate DS in a direction (e.g., the −z direction) to the stage 1100. Accordingly, damage to the display substrate DS may be prevented or reduced. In an embodiment, the first heat-dissipating layer HDL1 on the second surface S2 may be omitted.

In an embodiment, because the first heat-dissipating layer HDL1 is arranged on at least one of the first surface S1 and the second surface S2 of the stage 1100, heat conductivity and heat-dissipation efficiency may be improved (increased). Accordingly, fine temperature control may be made.

Referring to FIG. 8C, the stage 1100 may not include the stage opening. In this embodiment, the stage 1100 may extend continuously. The first heat-dissipating layer HDL1 may not include the heat-dissipating layer opening. In this embodiment, the first heat-dissipating layer HDL1 may extend continuously.

Figure 9:
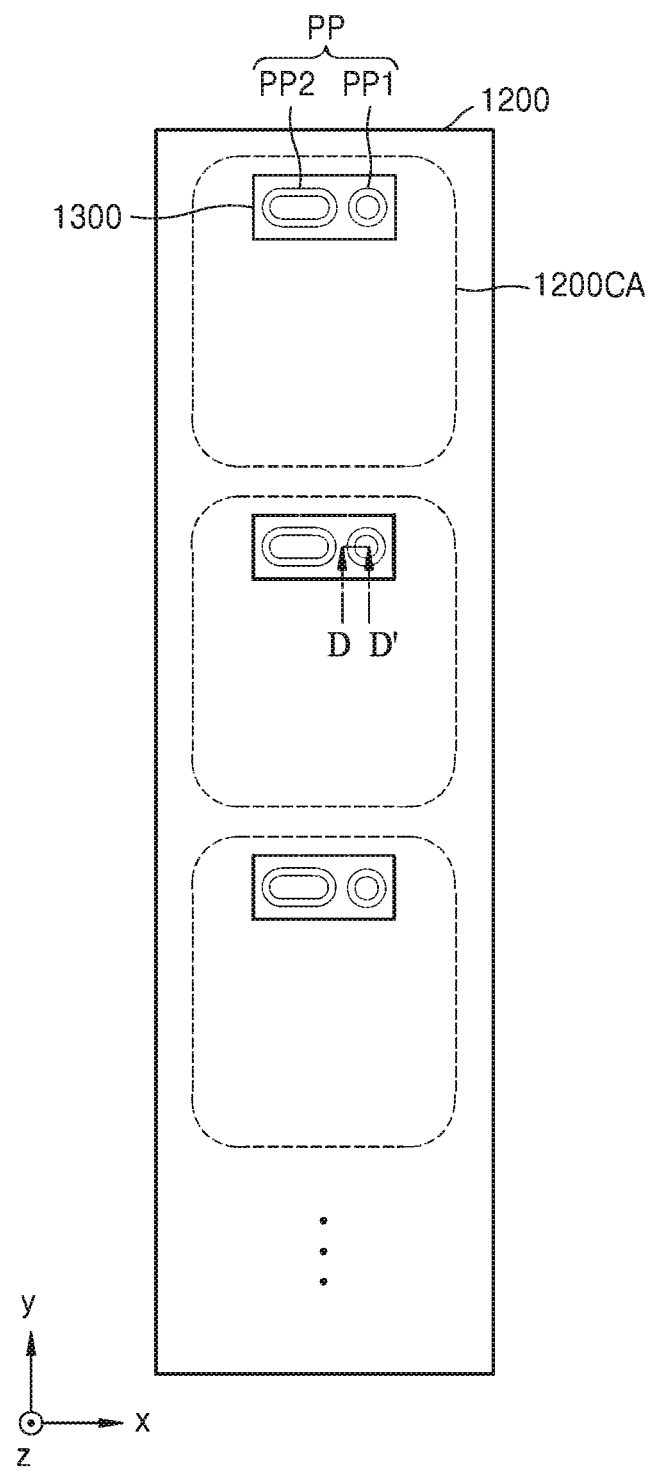
FIG. 9 is a plan view of a jig and a heat transfer unit, according to an embodiment.

FIG. 9 is a plan view of the jig 1200 and the heat transfer unit 1300 according to an embodiment.

Referring to FIG. 9, the jig 1200 may extend in the second direction (e.g., the y direction or the −y direction). The jig 1200 may include a jig cell area 1200CA. Plural jig cell areas 1200CA may be provided. Plural jig cell areas 1200CA may extend in the second direction (e.g., the y direction or the −y direction).

The heat transfer unit 1300 may be arranged on the jig 1200. The heat transfer unit 1300 may be arranged on the jig cell area 1200CA. Plural heat transfer units 1300 may be provided. Plural heat transfer units 1300 may each be arranged on the jig cell area 1200CA. Plural heat transfer units 1300 may extend in the second direction (e.g., the y direction or the −y direction).

The heat transfer unit 1300 may include a protrusion pin PP. In an embodiment, the heat transfer unit 1300 may include a plurality of protrusion pins PP. For example, the heat transfer unit 1300 may include a first protrusion pin PP1 and a second protrusion pin PP2. The first protrusion pin PP1 may have a shape substantially the same as or similar to the first opening area OA1 of FIG. 4. The second protrusion pin PP2 may have a shape substantially the same as or similar to the second opening area OA2 of FIG. 4.

Figure 10:
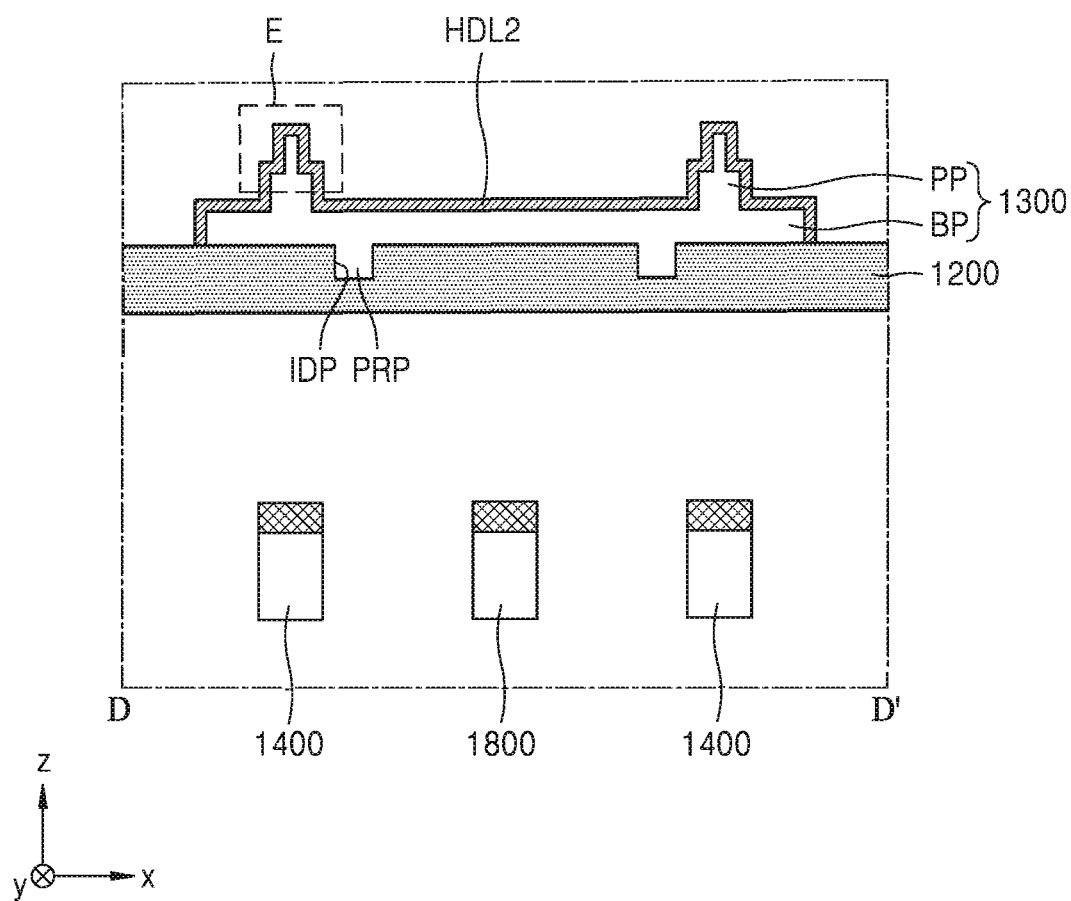
FIG. 10 is a cross-sectional view of a jig and a heat transfer unit of FIG. 9, taken along a line D-D.

FIG. 10 is a cross-sectional view of the jig 1200 and the heat transfer unit 1300 of FIG. 9, taken along line D-D.

Referring to FIG. 10, the heat transfer unit 1300 may be arranged on the jig 1200. The heat transfer unit 1300 is detachable from the jig 1200. Accordingly, even when the shape of the opening area of the display panel to be manufactured changes, the apparatus for manufacturing a display apparatus may manufacture the display panel by replacing only the heat transfer unit 1300.

In an embodiment, one of the jig 1200 and the heat transfer unit 1300 may include a protrusion protruding toward the other of the jig 1200 and the heat transfer unit 1300, and the other of the jig 1200 and the heat transfer unit 1300 may include an indented portion fit to the protrusion. For example, the heat transfer unit 1300 may include a protrusion PRP, and the jig 1200 may include an indented portion IDP. In another example, the jig 1200 may include a protrusion and the heat transfer unit 1300 may include an indented portion. Accordingly, the heat transfer unit 1300 is detachable from the jig 1200. In another embodiment, the jig 1200 may be screw-coupled to the heat transfer unit 1300.

The heat transfer unit 1300 may include a base portion BP and the protrusion pin PP. The base portion BP may be fixed to the jig 1200. The protrusion pin PP may be a portion protruding from the base portion BP. The heat transfer unit 1300 may include a material having a high heat transfer rate. The material of the heat transfer unit 1300 may be variously suitably changed by taking into account a heat transfer rate.

The apparatus for manufacturing a display apparatus may further include a second heat-dissipating layer HDL2. The second heat-dissipating layer HDL2 may cover the protrusion pin PP. In an embodiment, the second heat-dissipating layer HDL2 may cover the surfaces of the protrusion pin PP and the base portion BP.

In an embodiment, the second heat-dissipating layer HDL2 may include a carbon structure such as carbon nanotubes (CNTs), graphene, graphite, and/or the like. In an embodiment, the second heat-dissipating layer HDL2 may include a matrix based on silicon including particles, aluminum nitride (AlN), ZnO, and grease such as silicon oil and/or the like. In an embodiment, the second heat-dissipating layer HDL2 may include a phase change material (PCM) such as polyolefin, epoxy, low-molecular-weight polyesters, acryl, and/or the like. In an embodiment, the second heat-dissipating layer HDL2 may include gels such as silicone including aluminum (Al), aluminum oxide ($Al_2O_3$), and silver (Ag) particles, and/or an olefin matrix. In an embodiment, the second heat-dissipating layer HDL2 may include silver (Ag) particles and/or hardened epoxy. In an embodiment, the second heat-dissipating layer HDL2 may include metal or solder, the metal including at least one of indium (In), silver (Ag), tin (Sn), copper (Cu), and bismuth (Bi).

The laser unit 1400 may irradiate a laser beam to the heat transfer unit 1300. In an embodiment, the laser unit 1400 may be an infrared laser unit. In this embodiment, the laser unit 1400 may irradiate an infrared ray. Because the second heat-dissipating layer HDL2 covers the heat transfer unit 1300, the amount of heat dissipated in the z direction may increase. In an embodiment, plural laser units 1400 may be provided. In another embodiment, one laser unit 1400 may be configured to irradiate a laser to one heat transfer unit 1300.

The apparatus for manufacturing a display apparatus may further include a thermometer 1800. The thermometer may be configured to measure the temperature of the heat transfer unit 1300. In an embodiment, the thermometer 1800 may include a thermocouple. In this embodiment, the thermometer 1800 may be configured to measure the temperature of the heat transfer unit 1300 by using a contact method. In another embodiment, the thermometer 1800 may be an infrared thermometer. In this embodiment, the thermometer 1800 may be configured to measure the temperature of the heat transfer unit 1300 by using a non-contact method.

In an embodiment, the laser unit 1400 and the thermometer 1800 may be attached to the jig 1200. The laser unit 1400 may move in the same (substantially the same) direction as the thermometer 1800. In another embodiment, the laser unit 1400 and the thermometer 1800 may not be attached to the jig 1200. The laser unit 1400 and the thermometer 1800 may be attached to an additional jig. Even in this embodiment, the jig 1200 may move in the same (substantially the same) direction as the additional jig. In some embodiments, the laser unit 1400 may move independently of the thermometer 1800. Accordingly, the laser unit 1400 may irradiate a laser toward the heat transfer unit 1300, and the thermometer 1800 may measure the temperature of the heat transfer unit 1300.

FIGS. 11A to 11E are enlarged views of a region E of the heat transfer unit 1300 of FIG. 10 according to embodiments.

Referring to FIGS. 11A to 11E, the heat transfer unit 1300 may include the protrusion PP. The second heat-dissipating layer HDL2 may cover the protrusion pin PP. The protrusion pin PP may include a first part PPA and a second part PPB. The second part PPB may be arranged on the first part PPA. In an embodiment, the first part PPA and the second part PPB may be provided as one body.

Figure 11A:
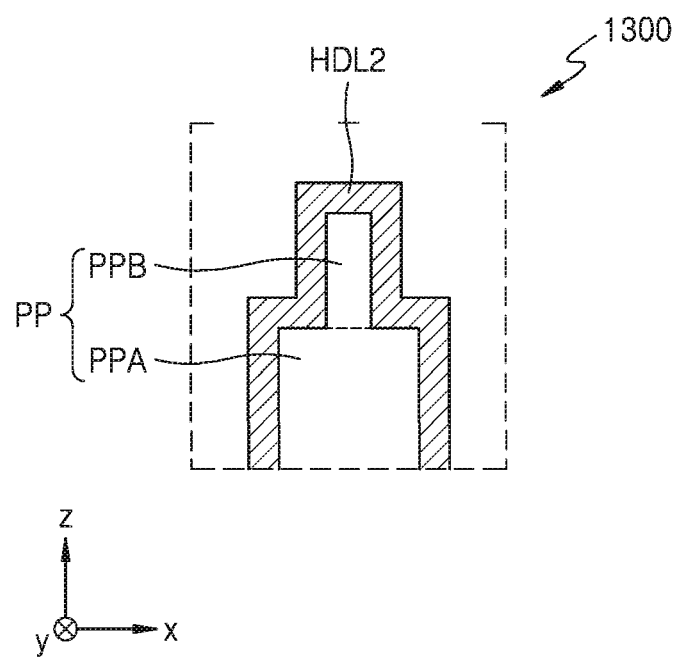
FIGS. 11A-11E are enlarged views of a region E of the heat transfer unit of FIG. 10, according to embodiments.

Referring to FIG. 11A, the first part PPA and the second part PPB may each have a quadrangular shape in a xy plane. The width of the second part PPB may be less than the width of the first part PPA.

Figure 11B:
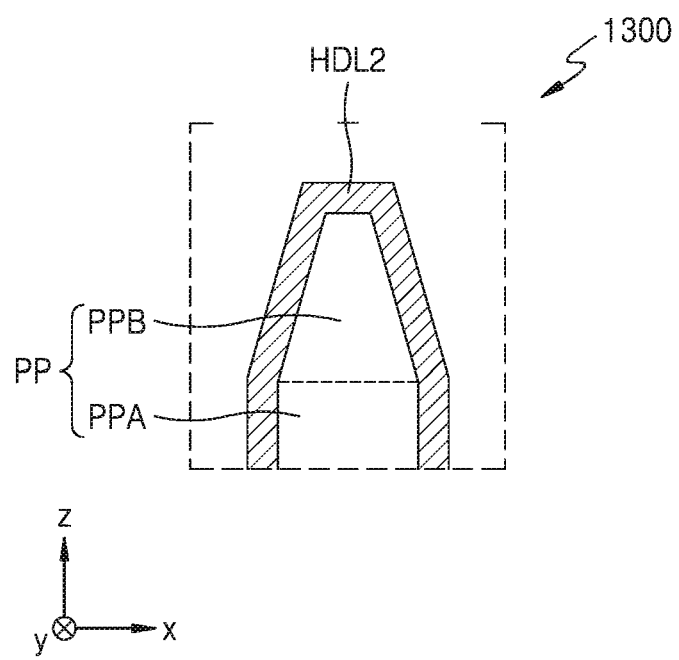

Referring to FIG. 11B, the second part PPB may have a trapezoidal shape in the xy plane.

Figure 11C:
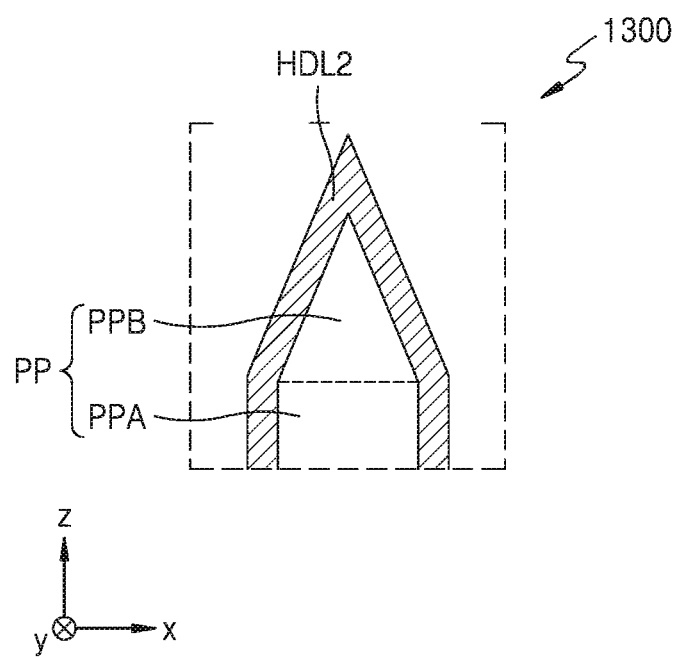

Referring to FIG. 11C, the second part PPB may have a triangular shape in the xy plane.

Figure 11D:
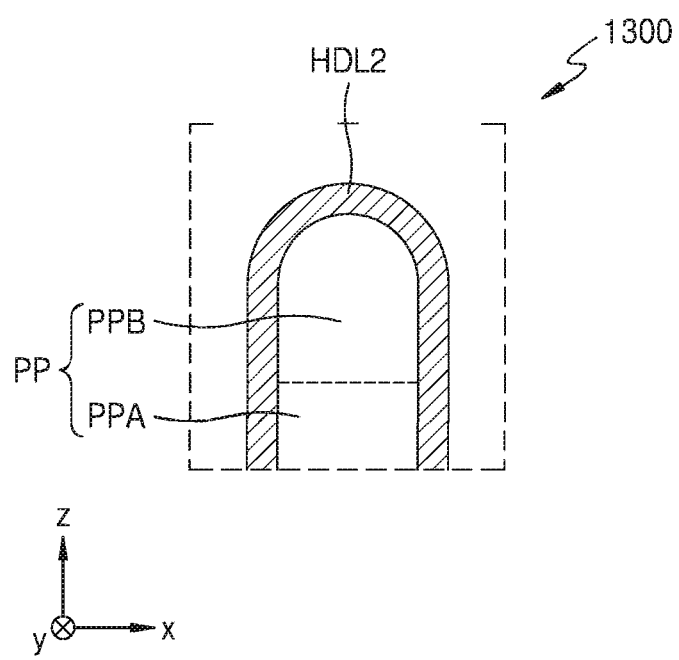

Referring to FIG. 11D, the edge of the second part PPB may have a curved shape.

Figure 11E:
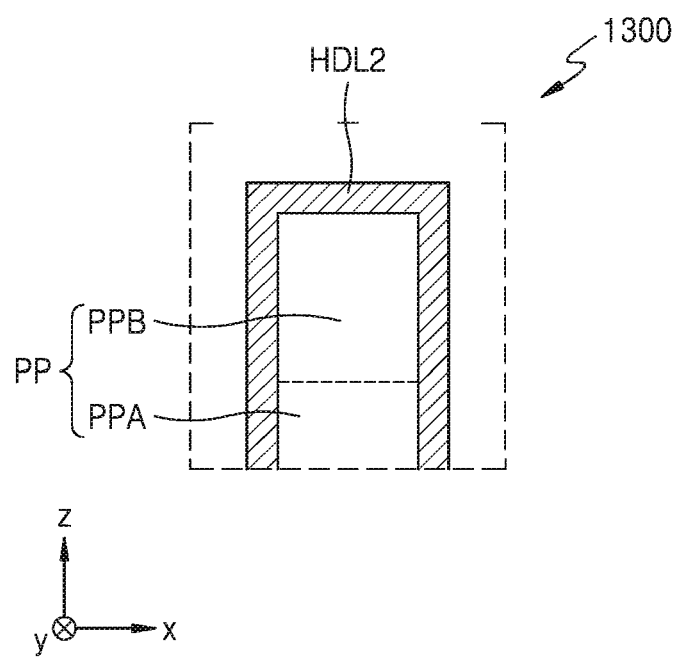

Referring to FIG. 11E, the width of the first part PPA may be the same (substantially the same) as that of the second part PPB. The heat transfer rate of the heat transfer unit 1300 may be adjusted by adjusting the shape of the protrusion pin PP.

FIGS. 12A to 12D are views showing a method of operating the apparatus for manufacturing a display apparatus. FIGS. 12A to 12D are views showing a method of operating the apparatus for manufacturing a display apparatus by using the apparatus for manufacturing a display apparatus 1000.

Figure 12A:
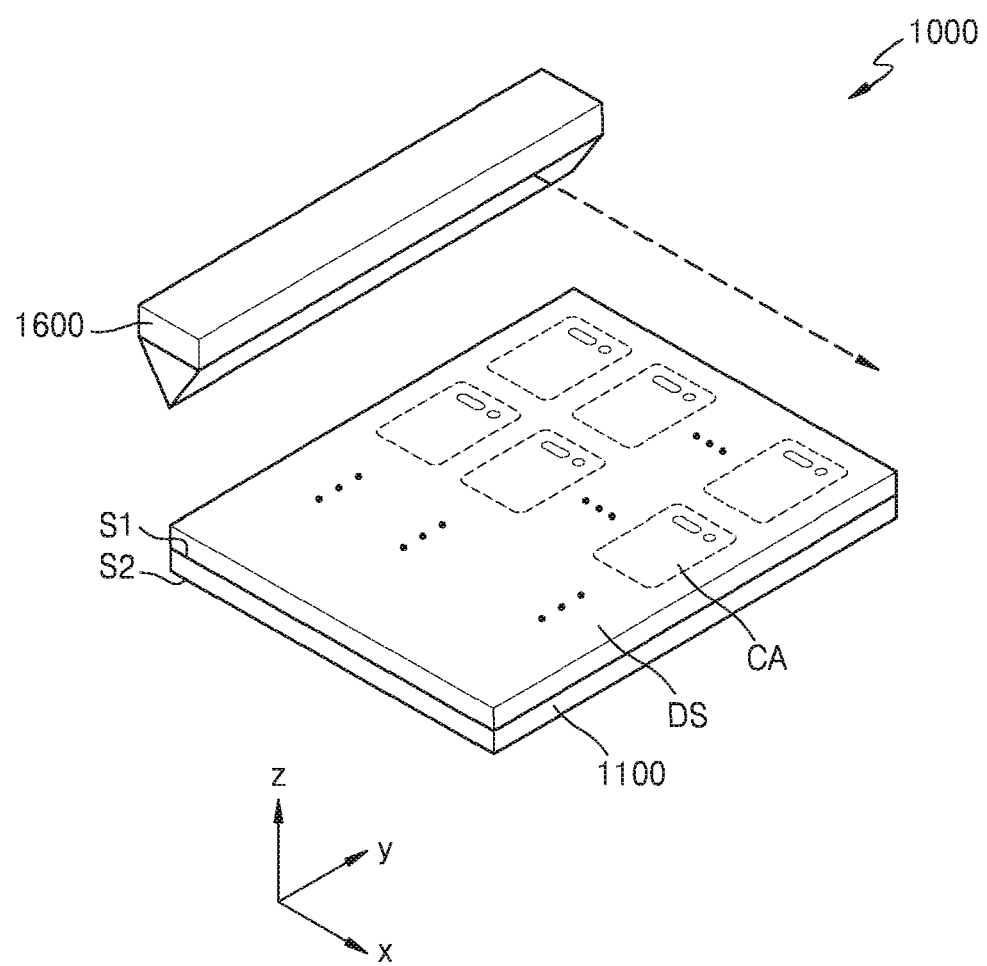
FIGS. 12A-12D are views showing a method of operating an apparatus for manufacturing a display apparatus.

Referring to FIG. 12A, the display substrate DS may be arranged on the stage 1100. The display substrate DS may be arranged on the first surface S1 of the stage 1100.

Next, the organic material discharger 1600 may be configured to move in the first direction (e.g., the x direction or the −x direction) automatically or manually. The organic material discharger 1600 may discharge an organic material on the display substrate DS. The organic material discharger 1600 may discharge an organic material on the plurality of cell areas CA. The organic material discharger 1600 may discharge an organic material by using, for example, inkjet printing.

Figure 12B:
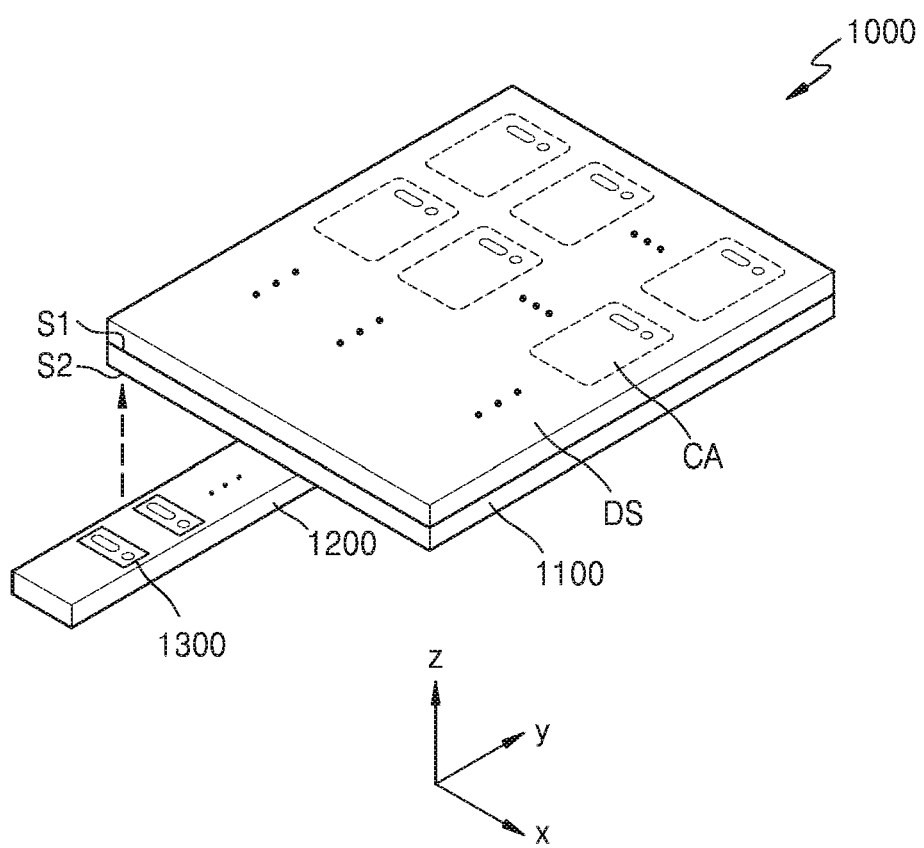

Referring to FIG. 12B, the jig 1200 on which the heat transfer unit 1300 is arranged may move in a direction (e.g., the z direction) closer to the stage 1100. The jig 1200 may be aligned with the stage 1100.

The apparatus 1000 for manufacturing a display apparatus may be configured to manufacture a large number of display apparatuses by using a plurality of display substrates DS. For example, after a first display substrate is seated on the stage 1100, a series of processes may be performed and the first display substrate may be detached from the stage 1100. Next, after a second display substrate is seated on the stage 1100, a series of processes may be performed and the second display substrate may be detached from the stage 1100. Accordingly, because the series of processes are performed on the first display substrate, heat may remain on the heat transfer unit 1300. If the heat transfer unit 1300 is always located close to the stage 1100, while the series of processes are formed on the second display substrate, the heat transfer unit 1300 may transfer heat unnecessarily to the second display substrate. In this embodiment, a mura phenomenon (clouding) may occur in the display apparatus being manufactured. However, in the present embodiment, when the heat transfer unit 1300 is required, the jig 1200 may move in a direction (e.g., the z direction) closer to the stage, and when the heat transfer unit 1300 is not required, the jig 1200 may move in a direction (e.g., the −z direction) away from the stage. Accordingly, heat may be prevented or reduced from being unnecessarily transferred to the display substrate DS, and a mura phenomenon may be prevented or reduced from occurring in the display apparatus being manufactured.

Figure 12C:
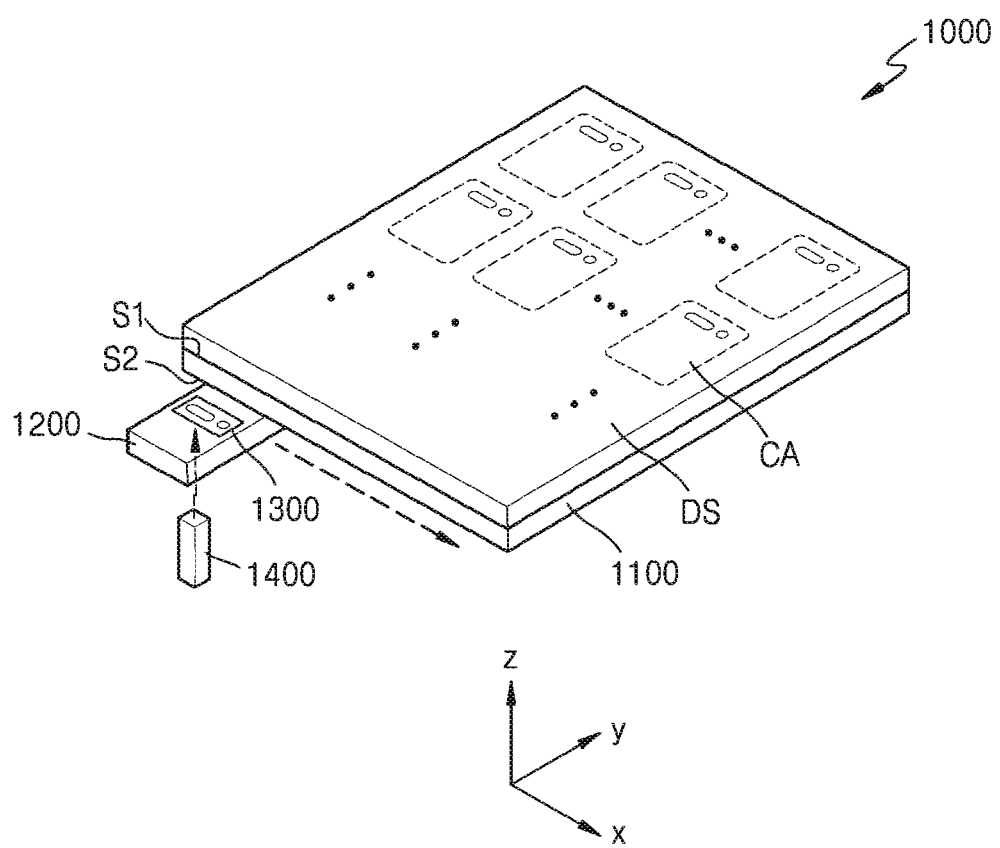

Referring to FIG. 12C, the laser unit 1400 may be configured to irradiate a laser beam to the heat transfer unit 1300. The heat transfer unit 1300 may transfer heat to the display substrate DS. Because the heat transfer unit 1300 is arranged in the second direction (e.g., the y direction or the −y direction), the heat transfer unit 1300 may transfer heat to the plurality of cell areas CA arranged in the second direction (e.g., the y direction or the −y direction).

Next, the jig 1200 and the laser unit 1400 may move in the first direction (e.g., the x direction or the −x direction). The laser unit 1400 may irradiate a laser to the heat transfer unit 1300. The heat transfer unit 1300 may transfer heat to the display substrate DS. Accordingly, the heat transfer unit 1300 may transfer heat to the plurality of cell areas CA arranged in the first direction (e.g., the x direction or the −x direction). The apparatus 1000 for manufacturing a display apparatus may transfer heat to the plurality of cell areas CA by using a small number of heat transfer units 1300.

Figure 12D:
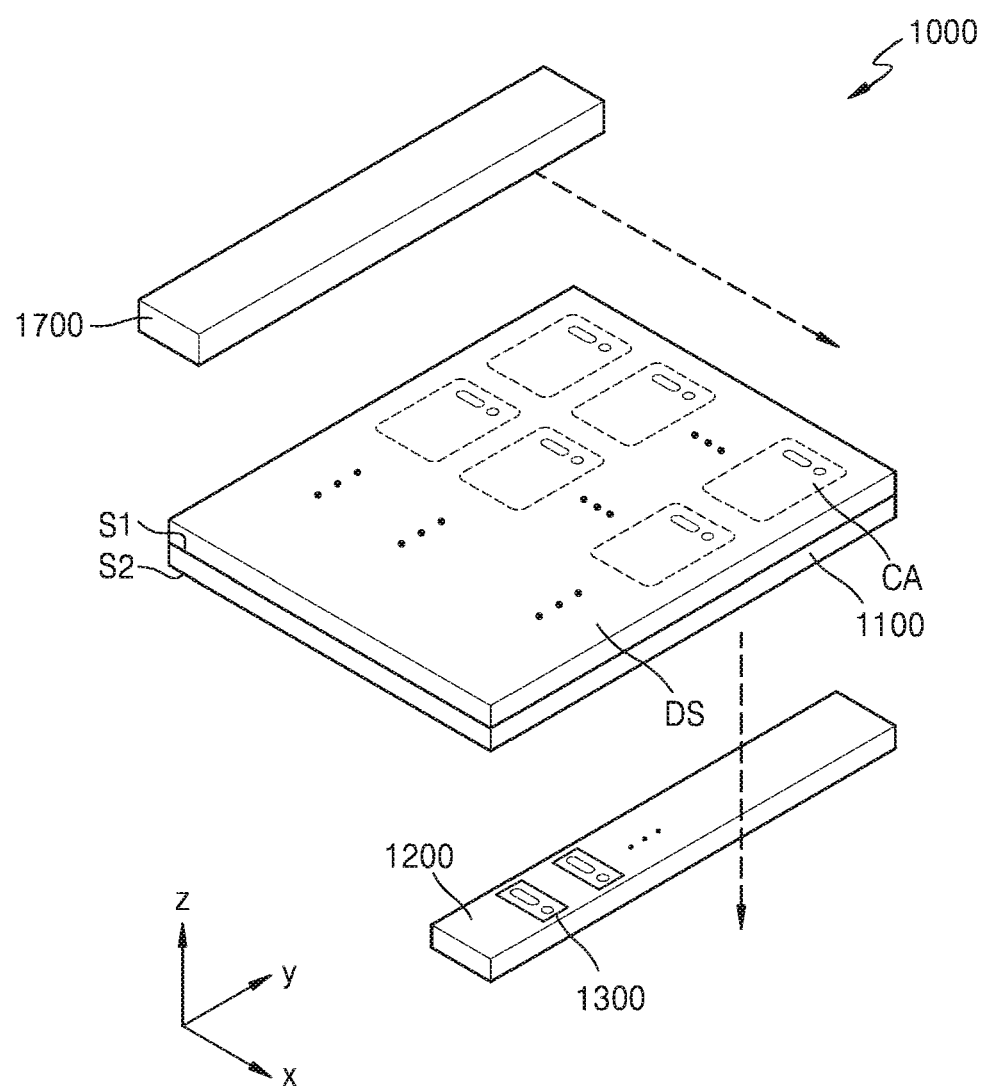

Referring to FIG. 12D, the ultraviolet irradiator 1700 may irradiate an ultraviolet ray. An organic material discharged to the display substrate DS may be hardened. The ultraviolet irradiator 1700 may irradiate an ultraviolet ray to the plurality of cell areas CA arranged in the second direction (e.g., the y direction or the −y direction).

Next, the ultraviolet irradiator 1700 may move in the first direction (e.g., the x direction or the −x direction). The ultraviolet irradiator 1700 may irradiate an ultraviolet ray to the plurality of cell areas CA. Accordingly, the ultraviolet irradiator 1700 may irradiate an ultraviolet ray to the plurality of cell areas CA arranged in the first direction (e.g., the x direction or the −x direction).

The jig 1200 may move in a direction (e.g., the −z direction) away from the stage. Accordingly, unnecessary heat may be prevented or reduced from being transferred to the display substrate DS from the heat transfer unit 1300.

Figure 13A:
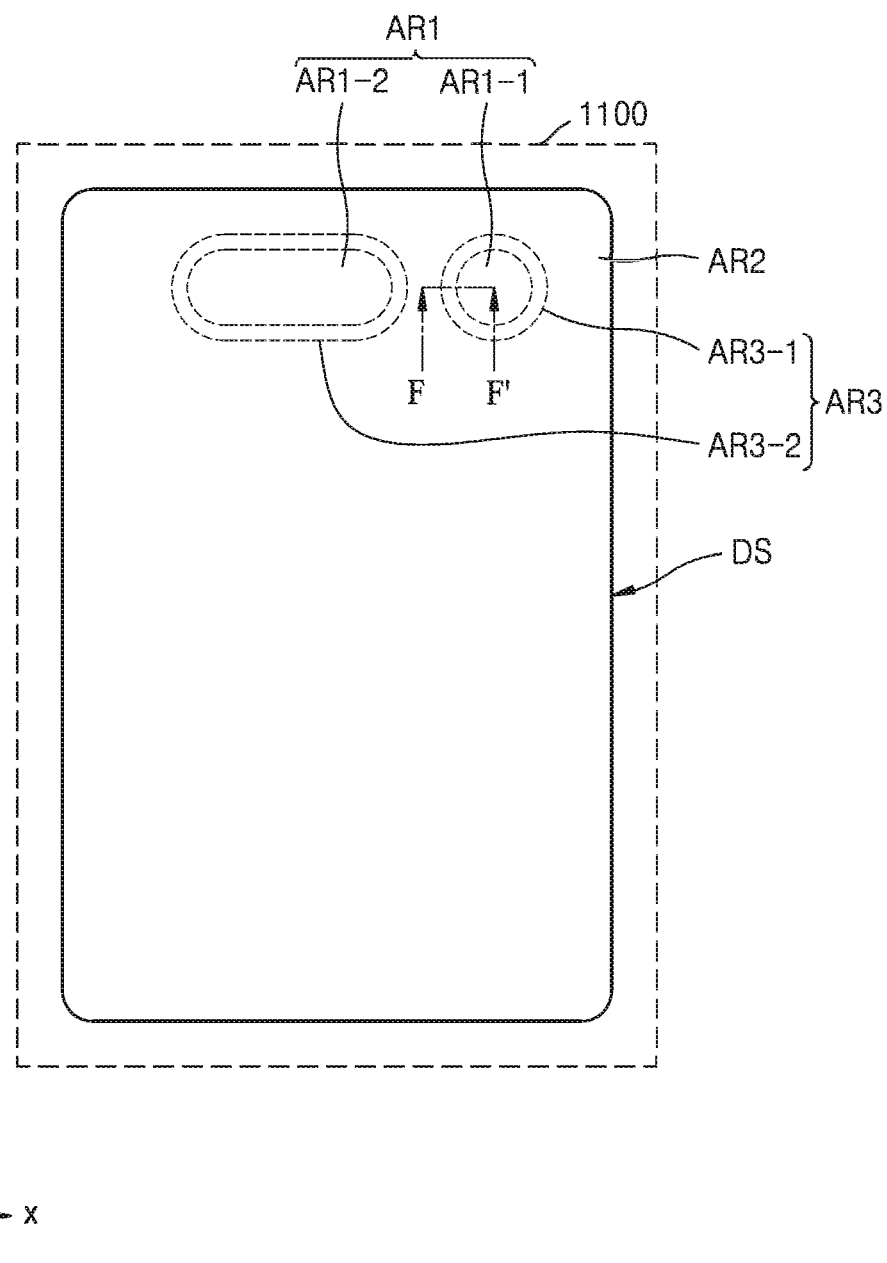
FIG. 13A is a plan view of a display apparatus being manufactured, according to an embodiment.

FIG. 13A is a plan view of a display apparatus being manufactured according to an embodiment. FIGS. 13B to 13H are cross-sectional views of a display apparatus being manufactured according to an embodiment. FIG. 13I is a plan view of a display apparatus being manufactured according to an embodiment. FIGS. 13B to 13H are cross-sectional views of the display substrate DS and the stage 1100, taken along line F-F' of FIG. 13A.

Figure 13B:
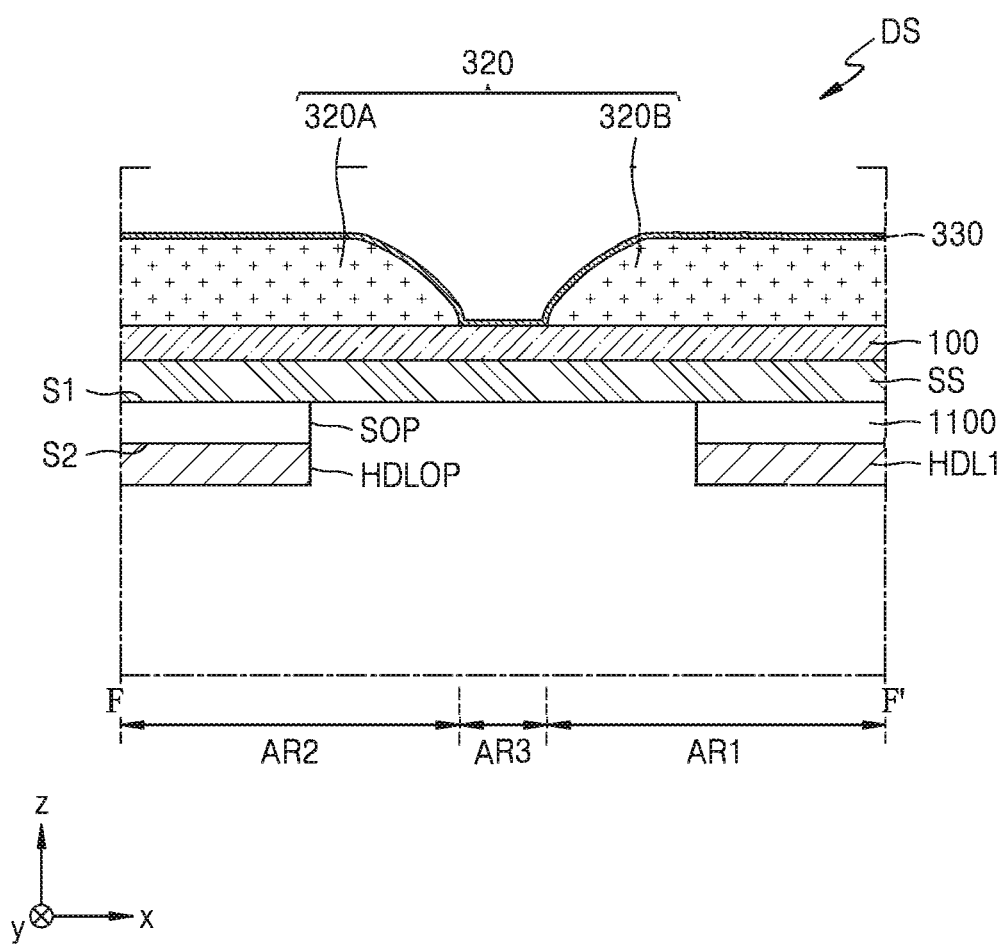
FIGS. 13B-13H are cross-sectional views of a display apparatus being manufactured, according to an embodiment.

Referring to FIGS. 13A and 13B, the display substrate DS may be arranged on the stage 1100. The display substrate DS may be arranged on the first surface S1 of the stage 1100. In an embodiment, a support substrate SS may be arranged on the stage 1100, and the display substrate DS may be arranged on the support substrate SS. The support substrate SS may include a material having hardness and rigidity that may support the display substrate DS. For example, the support substrate SS may include glass.

In an embodiment, the apparatus 1000 for manufacturing a display apparatus may include a chamber, and the display substrate DS and the stage 1100 may be arranged inside the chamber. The inside of the chamber may be maintained at about 25° C.

The display substrate DS may include a first region AR1, a second region AR2, and a third region AR3. In an embodiment, the first region AR1 may be a region that is to be the opening area OA of FIG. 4. In an embodiment, the first region AR1 may include a first partial region AR1-1 and a second partial region AR1-2. In an embodiment, the first partial region AR1-1 may be a region that is to be the first opening area OA1 of FIG. 4. In an embodiment, the second partial region AR1-2 may be a region that is to be the second opening area OA2 of FIG. 4. In another example, the first region AR1 may further include a third partial region. In another embodiment, the first region AR1 may be one region. Hereinafter, the embodiment in which the first region AR1 may include the first partial region AR1-1 and the second partial region AR1-2 is described in more detail.

The second region AR2 may surround the first region AR1. In an embodiment, the second region AR2 may be a region that is to be the display area DA of FIG. 4.

The third region AR3 may be arranged between the first region AR1 and the second region AR2. The third region AR3 may include a first intermediate region AR3-1 and a second intermediate region AR3-2. The first intermediate region AR3-1 may be arranged between the first partial region AR1-1 and the second region AR2. The second intermediate region AR3-2 may be arranged between the second partial region AR1-2 and the second region AR2.

The display substrate DS may include the substrate 100, the organic encapsulation layer 320, and the second inorganic encapsulation layer 330. The organic encapsulation layer 320 may be arranged on the substrate 100. The organic encapsulation layer 320 may include a first organic encapsulation region 320A and a second organic encapsulation region 320B. The first organic encapsulation region 320A may be arranged in the first region AR1. The second organic encapsulation region 320B may be arranged in the second region AR2. The first organic encapsulation region 320A may be spaced apart from the second organic encapsulation region 320B. In an embodiment, the first organic encapsulation region 320A may be spaced apart from the second organic encapsulation region 320B with the third region AR3 therebetween.

The second inorganic encapsulation layer 330 may cover the first organic encapsulation region 320A and the second organic encapsulation region 320B. In an embodiment, the second inorganic encapsulation layer 330 may continuously extend in the first region AR1, the second region AR2, and the third region AR3.

In an embodiment, the stage 1100 may include the stage opening SOP passing through the stage 1100 to overlap a region in which the display substrate DS is arranged. The stage opening SOP may overlap the third region AR3. In another embodiment, the stage 1100 may not include the stage opening SOP. In this embodiment, the stage 1100 may overlap and continuously extend in the first region AR1, the second region AR2, and the third region AR3.

The first heat-dissipating layer HDL1 may be arranged on one of the first surface S1 and the second surface S2 of the stage 1100. In an embodiment, the heat-dissipating layer HDL1 may have the heat-dissipating layer opening HDLOP overlapping the stage opening SOP.

Figure 13C:
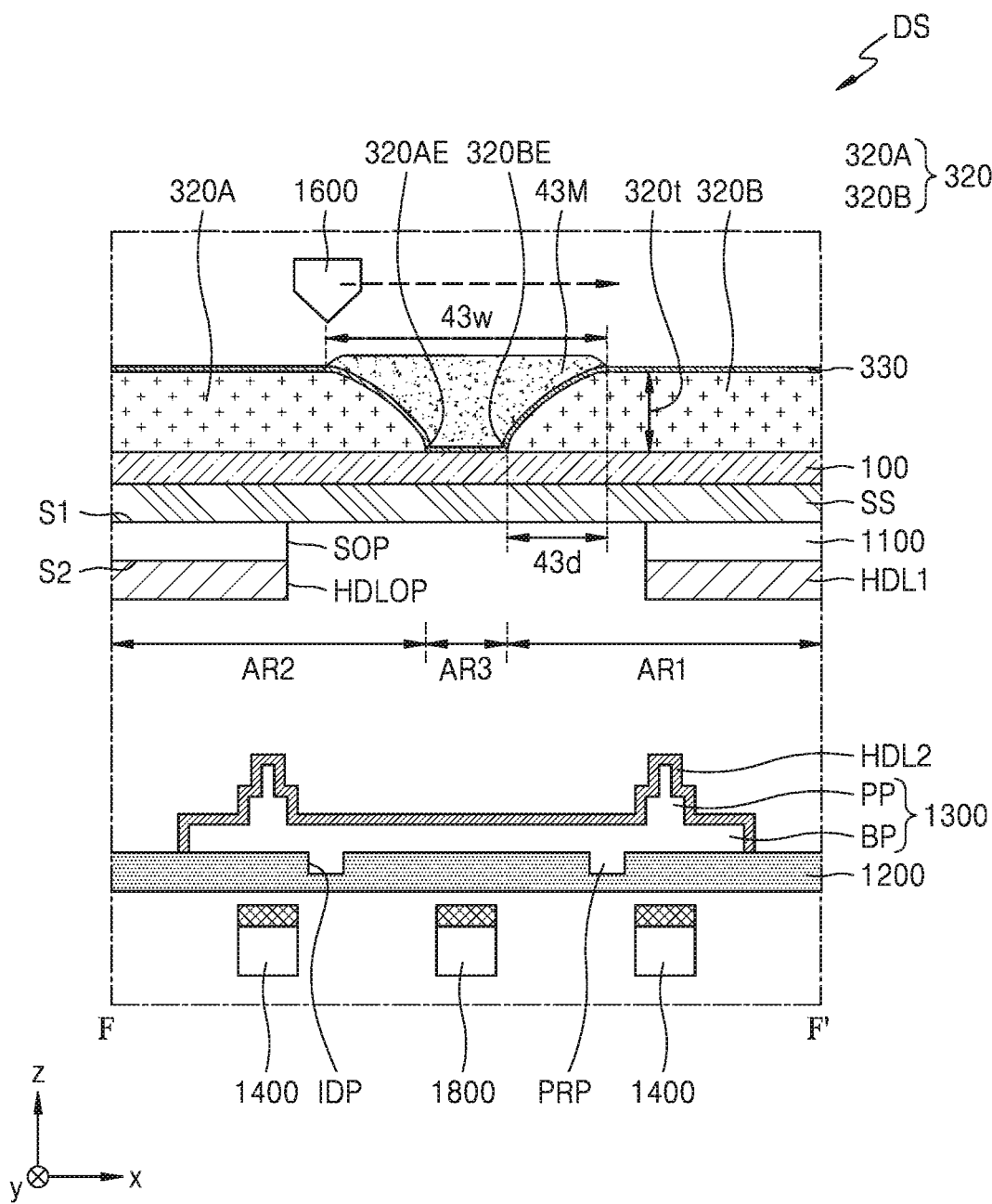

Referring to FIG. 13C, the organic material may be discharged in the third region AR3, and thus, an organic material layer 43M may be formed. The organic material discharger 1600 may discharge an organic material on the display substrate DS. In an embodiment, the organic material discharger 1600 may be configured to move in the first direction (e.g., the x direction or the −x direction).

The organic material layer 43M may be arranged between the first organic encapsulation region 320A and the second organic encapsulation region 320B. The first organic encapsulation region 320A and the second organic encapsulation region 320B may respectively include an edge 320AE of the first organic encapsulation region 320A and an edge 320BE of the second organic encapsulation region 320B. The organic material layer 43M may overlap each of the edge 320AE of the first organic encapsulation region 320A and the edge 320BE of the second organic encapsulation region 320B.

In an embodiment, a thickness 320t of the organic encapsulation layer 320 may be in a range of about 5 μm to about 30 μm. The thickness 320t of the organic encapsulation layer 320 may be a distance from the substrate 100 to the organic encapsulation layer 320 that is flat. In an embodiment, the thickness 320t of the organic encapsulation layer 320 may be in a range of about 5 μm to about 15 μm. In an embodiment, the thickness 320t of the organic encapsulation layer 320 may be in a range of about 7 μm to about 13 μm.

In an embodiment, a width 43w of the organic material layer 43M may be in a range of about 1 mm to about 10 mm. The width 43w of the organic material layer 43M may be a distance between the edges of the organic material layer 43M opposite to each other in the first direction (e.g., the x direction or the −x direction). In an embodiment, the width 43w of the organic material layer 43M may be in a range of about 2 mm to about 8 mm. In an embodiment, the width 43w of the organic material layer 43M may be in a range of about 3 mm to about 6 mm.

In an embodiment, an overlapping distance 43d between the organic material layer 43M and the organic encapsulation layer 320 may be in a range of about 50 μm to about 500 μm. The overlapping distance 43d may be a distance from the edge of the organic encapsulation layer 320 in the first direction (e.g., the x direction or the −x direction), for example, the edge 320BE of the second organic encapsulation layer 320B to the edge of the organic layer 43. In an embodiment, the overlapping distance 43d may be in a range of about 60 μm to about 300 μm. In an embodiment, the overlapping distance 43d may be in a range of about 70 μm to about 100 μm.

Referring to FIGS. 13C to 13F, the temperature of the edge area 43EA of the organic material layer 43M may be raised. Referring to FIG. 13C, the jig 1200, the heat transfer unit 1300, the laser unit 1400, and the thermometer 1800 may overlap the organic material layer 43M. In an embodiment, the jig 1200, the heat transfer unit 1300, the laser unit 1400, and the thermometer 1800 may overlap the organic material layer 43M in the third direction (e.g., the z direction or the −z direction).

The heat transfer unit 1300 may be arranged on the jig 1200. The heat transfer unit 1300 may include the protrusion pin PP protruding toward the base portion BP and the stage 1100. In an embodiment, the protrusion pin PP may have a shape extending in a direction in which the third area AR3 extends in FIG. 13A. The second heat-dissipating layer HDL2 may cover the protrusion pin PP. In an embodiment, the second heat-dissipating layer HDL2 may cover the surface of the protrusion pin PP and the base portion BP.

Figure 13D:
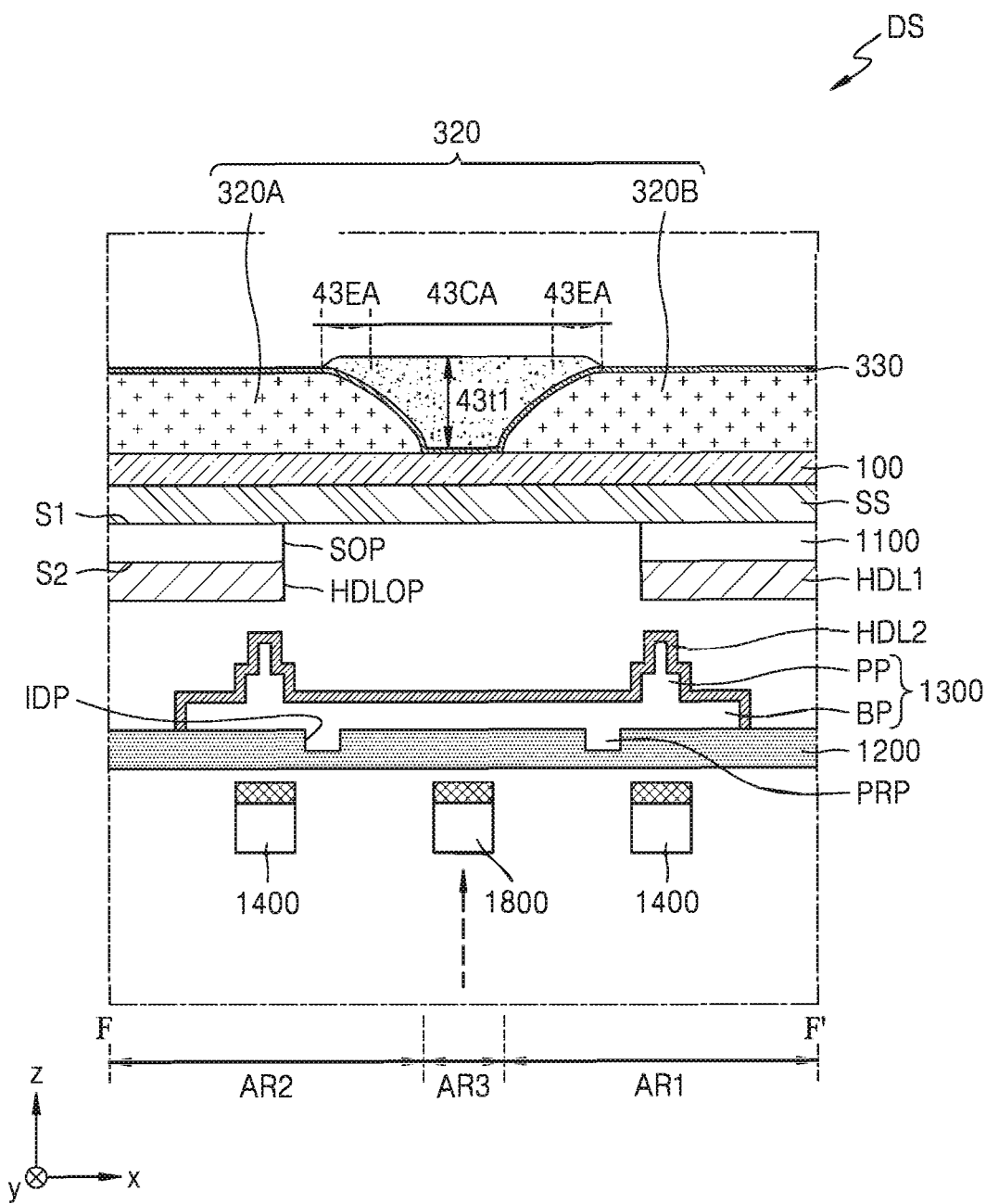
Figure 13E:
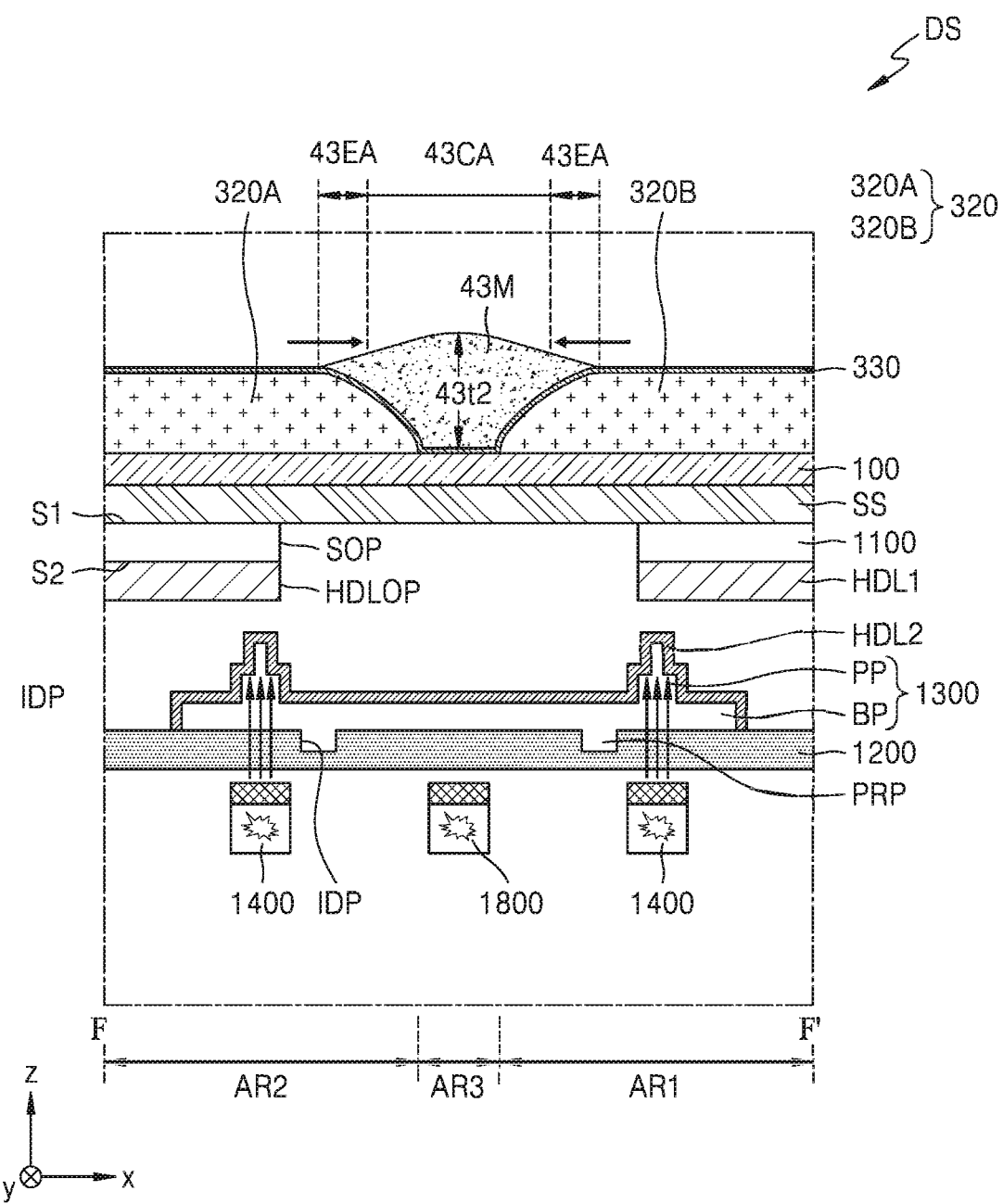

Referring to FIGS. 13D and 13E, the jig 1200, the heat transfer unit 1300, the laser unit 1400, and the thermometer 1800 may move to close to the stage 1100. In an embodiment, the jig 1200, the heat transfer unit 1300, the laser unit 1400, and the thermometer 1800 may move in the third direction (e.g., the z direction or the −z direction). Accordingly, when the heat transfer unit 1300 is needed, the jig 1200 may move in a direction (e.g., the z direction) closer to the stage 1100 and prevent or reduce unnecessary heat from being transferred to the display substrate DS. In this embodiment, a mura phenomenon may be prevented or reduced from occurring in the display apparatus being manufactured.

The laser unit 1400 may irradiate a laser to the heat transfer unit 1300 including the protrusion pin PP. In an embodiment, the laser unit 1400 may be an infrared laser unit and may irradiate an infrared ray to the heat transfer unit 1300. In an embodiment, a laser wavelength, a pulse duration, laser power, and/or the like of the laser unit 1400 may be adjusted. Accordingly, the temperature of the heat transfer unit 1300 including the protrusion pin PP may be raised.

The temperature of the heat transfer unit 1300 may be higher than room temperature. The temperature of the heat transfer unit 1300 may be maintained constant. In an embodiment, the thermometer 1800 may directly or indirectly measure the temperature of the heat transfer unit 1300. The laser unit 1400 may irradiate a laser beam to the heat transfer unit 1300 by taking into account the temperature of the heat transfer unit 1300.

The heat transfer unit 1300 may transfer heat to the organic material layer 43M. Because the second heat-dissipating layer HDL2 covers the heat transfer unit 1300, the amount of heat dissipated in the z direction may increase. In an embodiment, the protrusion pin PP may transfer heat to the organic material layer 43M while being spaced apart from the stage 1100. In this embodiment, the heat transfer unit 1300 may transfer heat to the organic material layer 43M through convection and/or radiation. Accordingly, when the protrusion pin PP contacts the stage 1100, a defect that may occur due to impacts with the stage may be prevented (reduced). In an embodiment, the protrusion pin PP may transfer heat to the organic material layer 43M while contacting the stage 1100.

The organic material layer 43M may include a central area 43CA and an edge area 43EA. The central area 43CA may overlap the third region AR3. The edge area 43EA may overlap the first region AR1 or the second region AR2. The organic material layer 43M may be a layer for planarizing a stack structure of the display panel under the organic material layer 43M. However, a meniscus may occur in the edge area 43EA of the organic material layer 43M. This is because a contact angle is formed by the organic material layer 43M and the layer under the organic material layer 43M due to surface tension of the organic material layer 43M. In an embodiment, the surface tension of the organic material layer 43M in the edge area 43EA may be in a range of about 10 mN/m and about 50 mN/m. In an embodiment, the surface tension of the organic material layer 43M in the edge area 43EA may be in a range of about 10 mN/m and about 40 mN/m. In an embodiment, the surface tension of the organic material layer 43M in the edge area 43EA may be in a range of about 10 mN/m and about 30 mN/m. In an embodiment, the viscosity of the organic material layer 43M may be in a range of about 1 cps to about 50 cps. In an embodiment, the viscosity of the organic material layer 43M may be in a range of about 1 cps to about 40 cps. In an embodiment, the viscosity of the organic material layer 43M may be in a range of about 15 cps to about 25 cps. In this embodiment, the organic material layer 43M is hardened, and then, an additional planarization process may be required.

In an embodiment, heat may be applied to the edge area 43EA of the organic material layer 43M. The contact angle is related to the surface energy of the organic material layer 43M. A meniscus needs to be prevented or reduced by reducing the surface energy of the organic material layer 43M in the edge area 43EA. Because the surface energy of the organic material layer 43M is reduced as the temperature of the organic material layer 43M is increased, the surface energy of the organic material layer 43M may be reduced by applying heat to the edge area 43EA of the organic material layer 43M. Accordingly, the meniscus in the edge area 43EA of the organic material layer 43M may be prevented or reduced. In addition, the organic material layer 43M is hardened, and then, an additional planarization process may not be required.

When heat is applied to the edge area 43EA of the organic material layer 43M, the thickness of the central area 43CA of the organic material layer 43M may increase. For example, the thickness of the central area 43CA of the organic material layer 43M may change from a first thickness 43t1 to a second thickness 43t2 greater than the first thickness 43t1. This is because the temperature of the edge area 43EA of the organic material layer 43M is greater than the temperature of the central area 43CA of the organic material layer 43M. In an embodiment, a temperature difference between the edge area 43EA of the organic material layer 43M and the central area 43CA of the organic material layer 43M may be in a range of about 0.1° C. to about 10° C. In an embodiment, a temperature difference between the edge area 43EA of the organic material layer 43M and the central area 43CA of the organic material layer 43M may be in a range of about 1° C. to about 8° C. In an embodiment, a temperature difference between the edge area 43EA of the organic material layer 43M and the central area 43CA of the organic material layer 43M may be in a range of about 2° C. to about 5° C.

The viscosity of the edge area 43EA of the organic material layer 43M is less than the temperature of the central area 43CA of the organic material layer 43M. In this embodiment, due to the Marangoni effect, the organic material layer 43M may flow from the edge area 43EA of the organic material layer 43M to the central area 43CA of the organic material layer 43M. Accordingly, the thickness of the central area 43CA of the organic material layer 43M may increase.

Figure 13F:
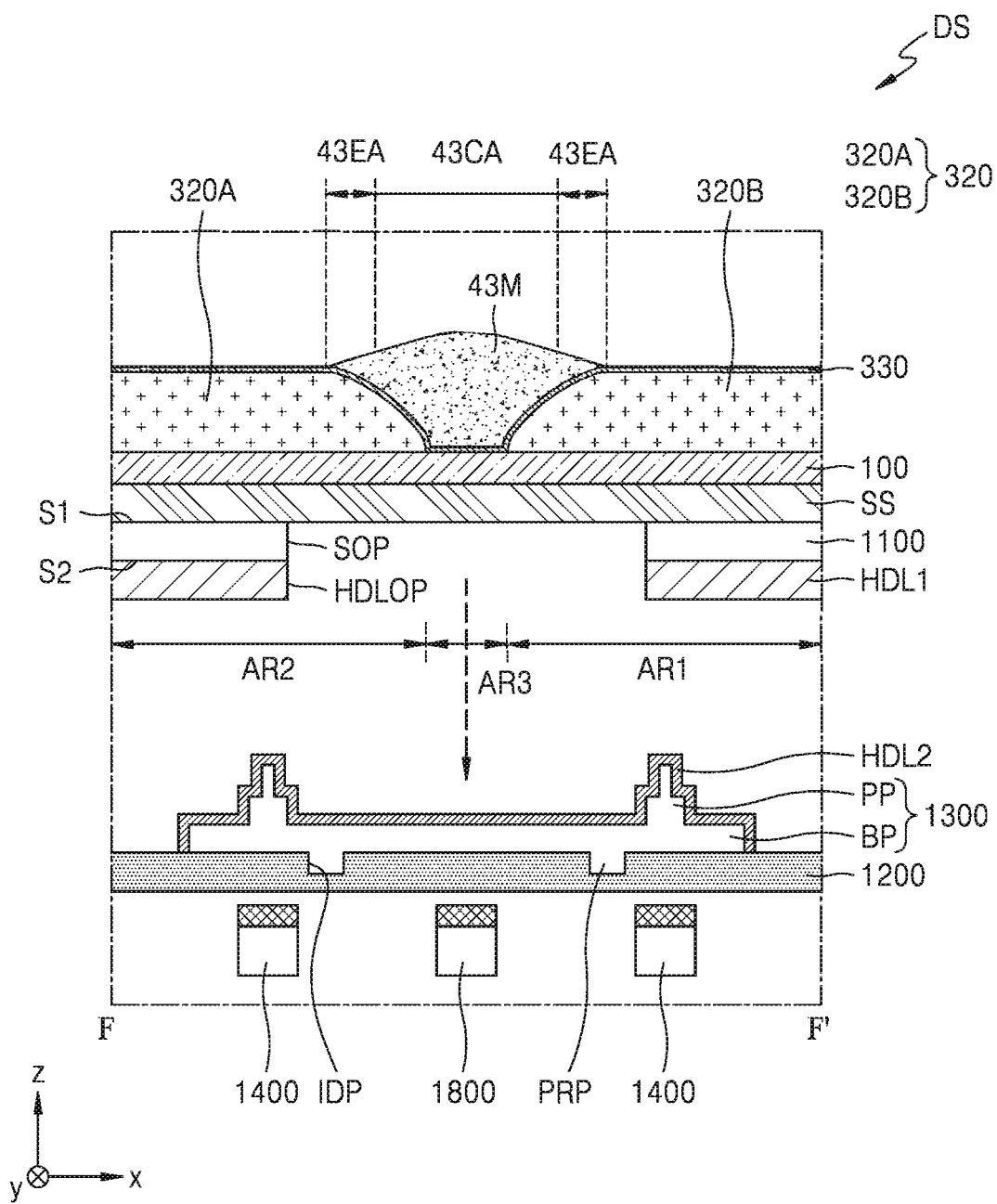

Referring to FIG. 13F, the jig 1200, the heat transfer unit 1300, the laser unit 1400, and the thermometer 1800 may move in a direction (e.g., the −z direction) away from the stage 1100. Accordingly, heat may be prevented or reduced from being transferred unnecessarily to the display substrate DS, and a mura phenomenon may be prevented or reduced from occurring in the display apparatus being manufactured.

Figure 13G:
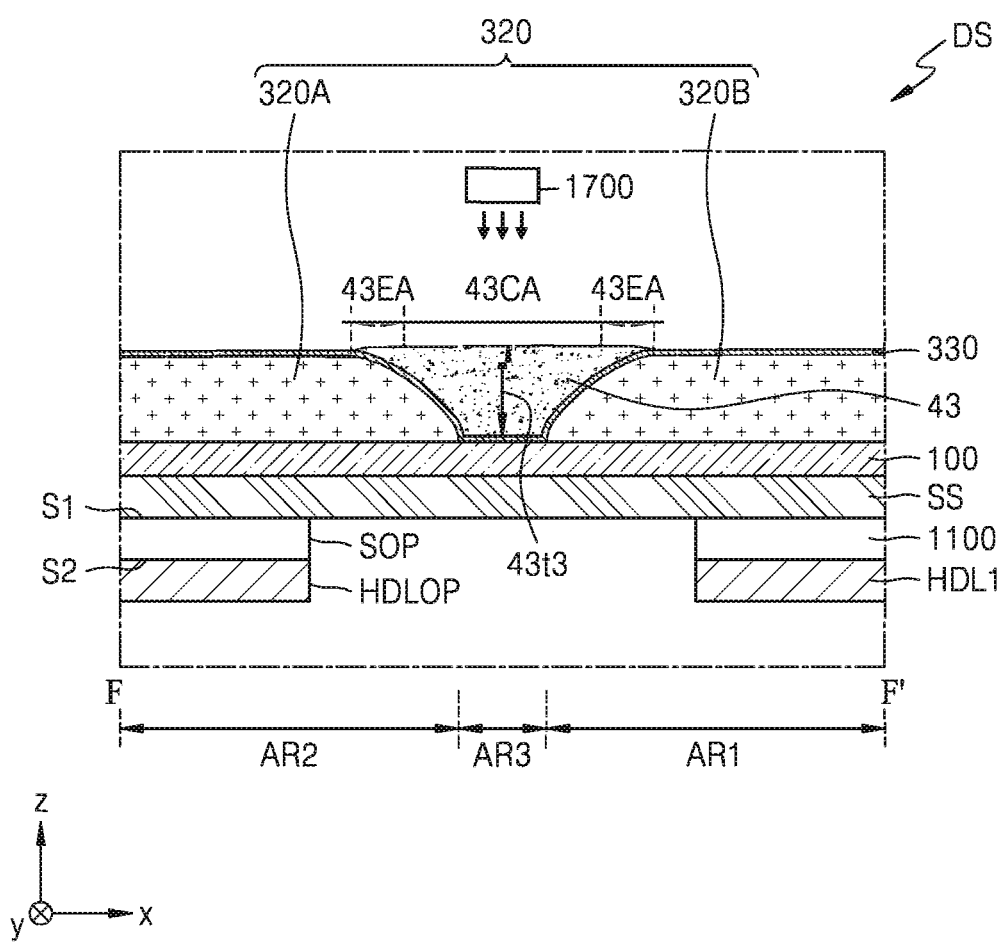

Referring to FIG. 13G, the organic material layer is hardened to form the organic layer 43. In an embodiment, the ultraviolet ray 1700 may irradiate an ultraviolet ray to the organic material layer, and the organic material layer may be hardened.

In an embodiment, the thickness of the central area 43CA of the organic material layer may be reduced. As an example, the thickness of the central area 43CA of the organic material layer 43M may change from the second thickness 43t2 to a third thickness 43t3 less than the second thickness 43t2. Unlike the present embodiment, when the organic material layer 43M is formed and then immediately hardened without a process of increasing the temperature of the edge area 43EA of the organic material layer 43M, the thickness of the organic material layer 43M may be less than the first thickness 43t1. In this embodiment, the organic layer 43 may have an indented shape. In the present embodiment, the temperature of the edge area 43EA of the organic material layer 43M may be increased, and the organic material layer 43M may flow from the edge area 43EA of the organic material layer 43M to the central area 43CA of the organic material layer 43M due to the Marangoni effect. Accordingly, the thickness of the central area 43CA of the organic material layer 43M may increase. Next, because the organic material layer is hardened, the organic layer that is substantially planarized may be formed.

In an embodiment, because the first heat-dissipating layer HDL1 is arranged on the second surface S2 of the stage 1100, heat accumulated in the stage 1100 may be dissipated through the first heat-dissipating layer HDL1. Accordingly, the display substrate DS may be prevented or reduced from being damaged by heat accumulated in the stage 1100.

Figure 13H:
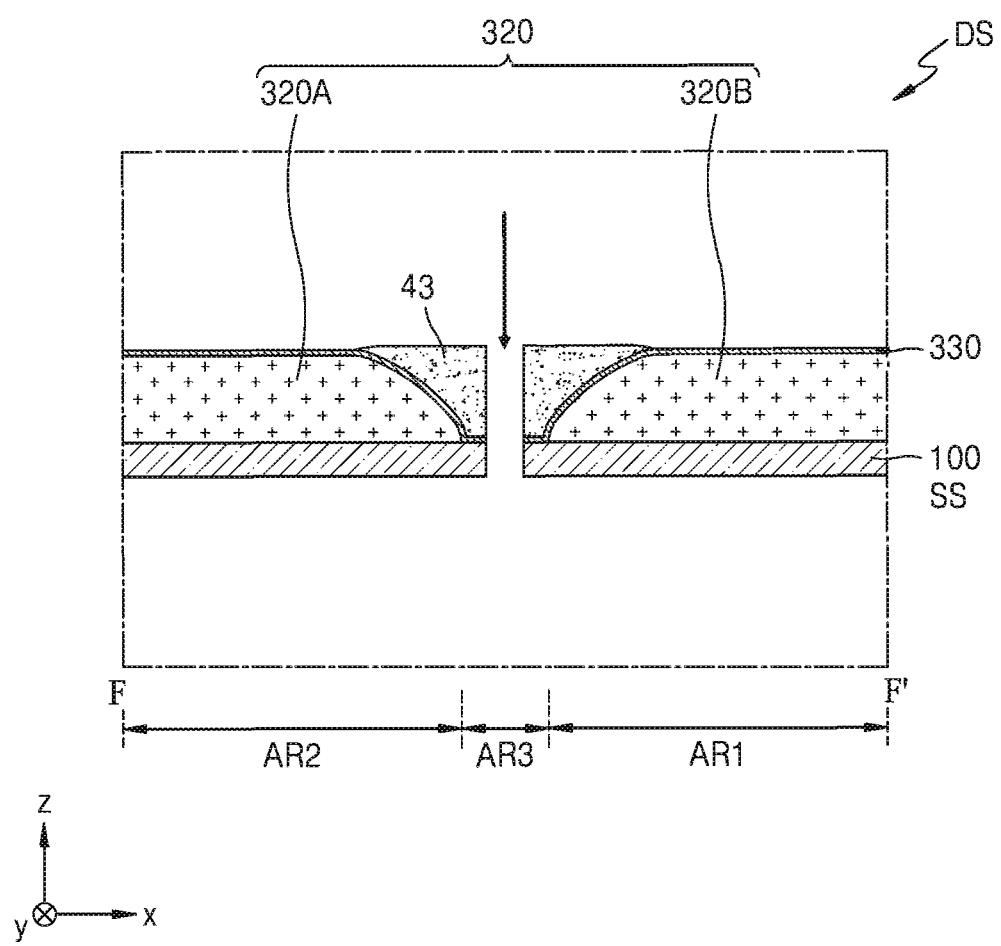
Figure 13I:
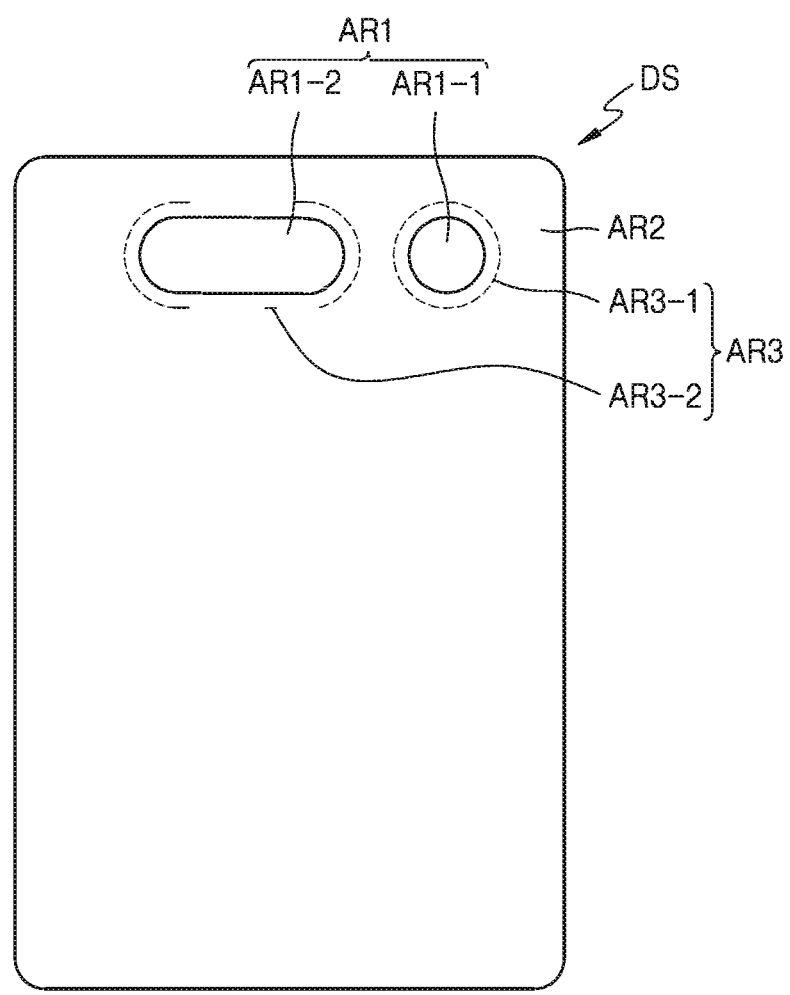
FIG. 13I is a plan view of a display apparatus being manufactured, according to an embodiment.

Referring to FIG. 13H, the first region AR1 may be separated from the second region AR2. In an embodiment, a laser may be irradiated to the third region AR3, and the third region AR3 may be cut.

Referring to FIG. 13I, a portion of the display substrate DS arranged in the first region AR1 may be removed. Accordingly, the first region AR1 may be the opening area of FIG. 4.

Figure 14:
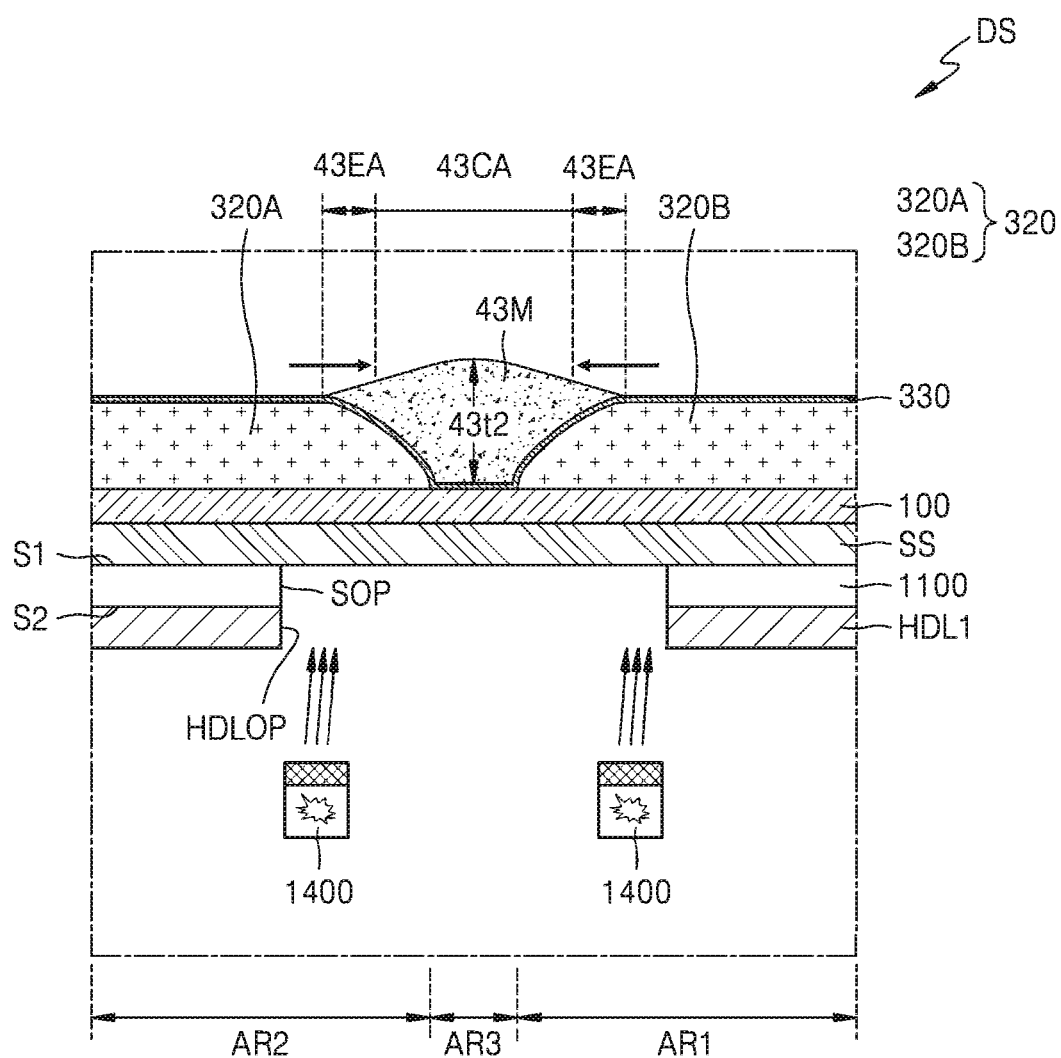
FIG. 14 is a plan view of a display apparatus being manufactured, according to another embodiment.

FIG. 14 is a plan view of a display apparatus being manufactured according to another embodiment. In FIG. 14, the same reference numerals as those of FIG. 13E denote the same members, and thus, repeated descriptions thereof are not repeated here.

Referring to FIG. 14, the laser unit 1400 may irradiate a laser beam to the edge area 43EA of the organic material layer 43M. The laser unit 1400 may irradiate a laser beam to the edge area 43EA of the organic material layer 43M through the stage opening SOP and the heat-dissipating layer opening HDLOP. For example, a laser may be irradiated to the edge area 43EA of the organic material layer 43M without using the heat transfer unit. The laser unit 1400 may be an infrared laser unit.

In the embodiment in which the viscosity of the organic material layer 43M is 50 cps or more, the laser unit 1400 may irradiate a laser through the stage opening SOP and the heat-dissipating layer opening HDLOP, and the temperature of the edge area 43EA of the organic material layer 43M may be adjusted.

Figure 15:
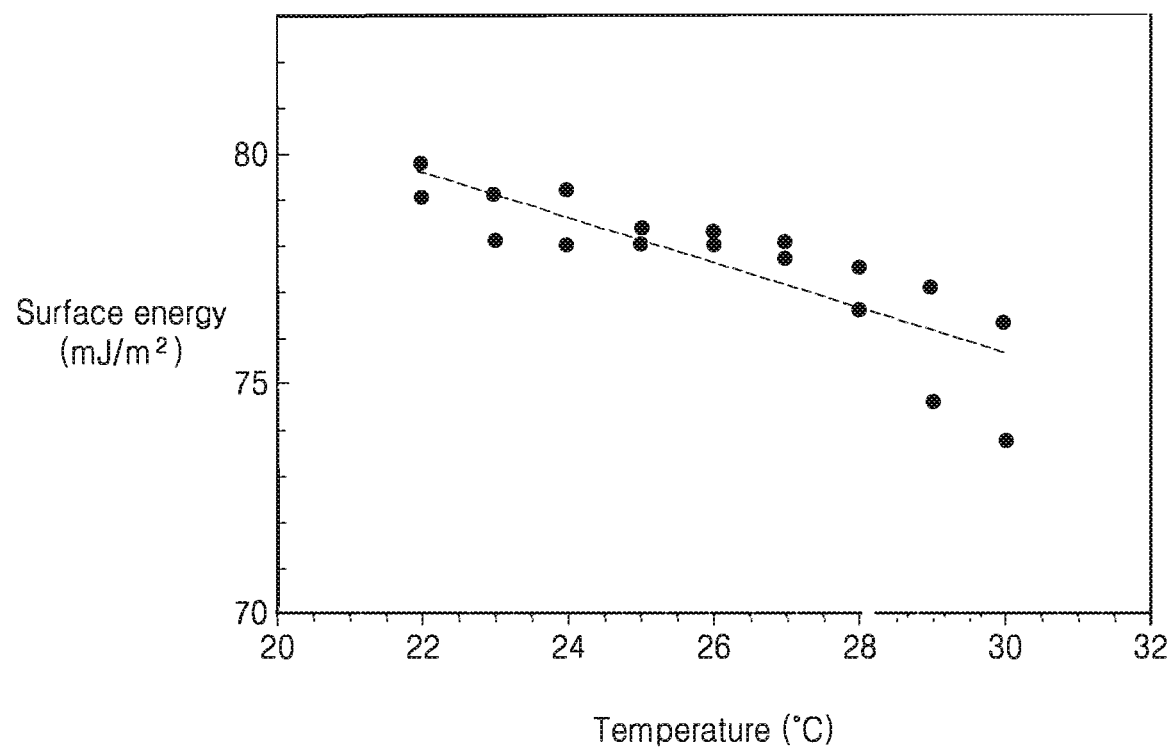
FIG. 15 is a graph showing the relationship between the surface energy of an organic material layer and temperature.

FIG. 15 is a graph showing relationship of the surface energy of an organic material layer according to temperature.

Referring to FIG. 15, a tendency in which the surface energy of the organic material layer is reduced as temperature increase may be generally available. Accordingly, as the temperature of the edge area of the organic material layer increases, the surface energy of the organic material layer may be reduced and a meniscus may be prevented or reduced.

Figure 16:
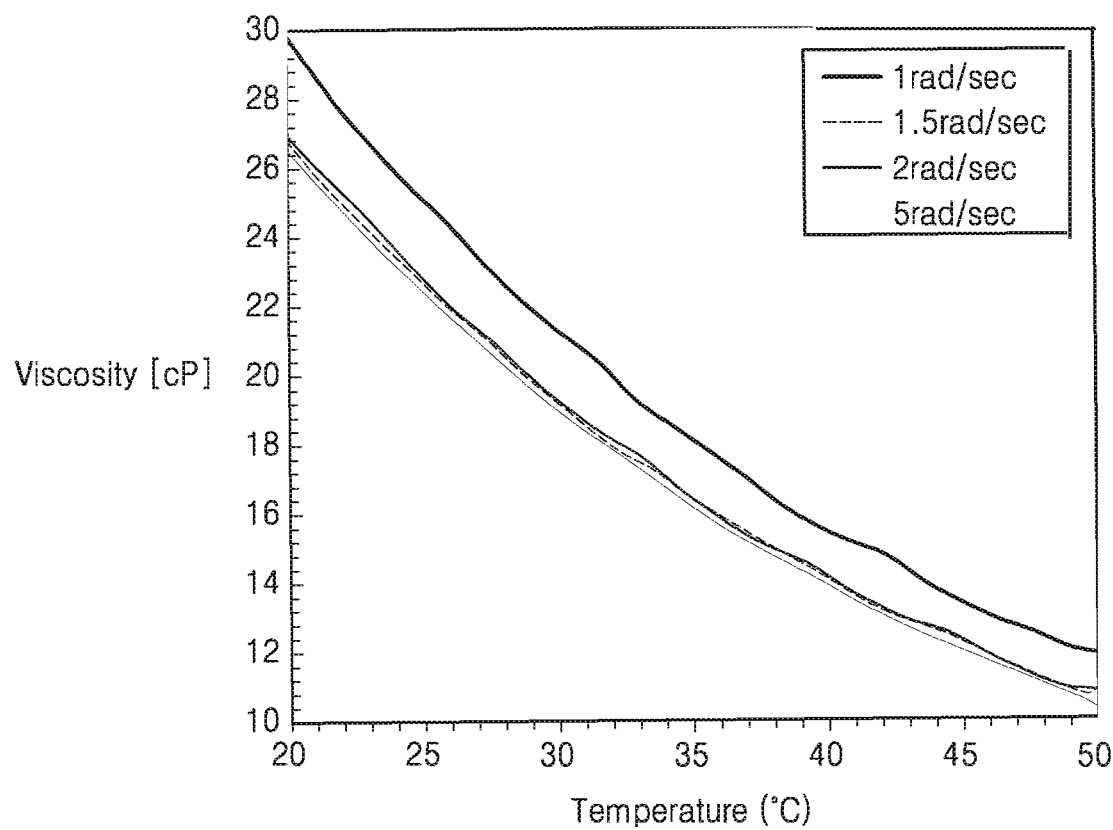
FIG. 16 is a graph showing the relationship between the viscosity of an organic material layer and temperature.

FIG. 16 is a graph showing the relationship of the viscosity of the organic material layer 43M according to temperature.

Referring to FIG. 16, as temperature increases, the viscosity of the organic material layer may be reduced. Similar tendency may be generally available in each angular velocity (e.g., 1, 1.5, 2, and 5 rad/s). Accordingly, the organic material layer 43M may flow from the edge area 43EA of the organic material layer 43M to the central area 43CA of the organic material layer 43M due to the Marangoni effect.

As described above, in the apparatus for manufacturing a display apparatus according to an embodiment may include the heat transfer unit and the laser unit, the heat transfer unit being arranged on the jig and including the protrusion pin that protrudes toward the second surface of the stage, and the laser unit irradiating a laser. Accordingly, heat may be applied to the display panel being manufactured, and the organic layer having a flat upper surface may be formed.

In addition, the method of manufacturing a display apparatus according to an embodiment may increase the temperature of the edge area of the organic material layer. Accordingly, a meniscus may be prevented or reduced by reducing the surface energy of the organic material layer in the edge area, and the upper surface of the organic layer formed by hardening the organic material layer may be planarized.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure as defined by the following claims, and equivalents thereof.

What is claimed is:

1. An apparatus for manufacturing a display apparatus, the apparatus comprising:
    a stage comprising a first surface and a second surface, wherein a display substrate is arranged on the first surface, and the second surface is opposite to the first surface;
    a jig facing the second surface;
    a heat transfer unit arranged on the jig, the heat transfer unit comprising a protrusion pin protruding toward the second surface;
    a laser unit configured to irradiate a laser beam to the heat transfer unit;
    an organic material discharger configured to discharge an organic material toward the display substrate; and
    an ultraviolet irradiator configured to irradiate an ultraviolet ray toward the organic material discharged.

2. The apparatus of claim 1, wherein the stage comprises a stage opening passing through the stage to overlap a region in which the display substrate is arranged.

3. The apparatus of claim 1, further comprising a first heat-dissipating layer arranged on the second surface of the stage.

4. The apparatus of claim 1, further comprising a second heat-dissipating layer covering the protrusion pin.

5. The apparatus of claim 1, wherein the heat transfer unit is detachable from the jig.

6. The apparatus of claim 1, further comprising:
    a first guide configured to guide the jig to move in a first direction; and
    a second guide configured to guide the jig to move in one of a direction closer to the stage or a direction away from the stage.

7. The apparatus of claim 6, wherein the jig extends in a second direction crossing the first direction,
    the heat transfer unit comprises a plurality of heat transfer units, and
    the plurality of heat transfer units are arranged in the second direction on the jig.

8. The apparatus of claim 6, wherein the laser unit moves concurrently with the heat transfer unit.

9. An apparatus for manufacturing a display apparatus, the apparatus comprising:
    a stage comprising a first surface and a second surface, wherein a display substrate is arranged on the first surface, and the second surface is opposite to the first surface;
    a jig facing the second surface;
    a heat transfer unit arranged on the jig, the heat transfer unit comprising a protrusion pin protruding toward the second surface; and
    a laser unit configured to irradiate a laser beam to the heat transfer unit,
    wherein the heat transfer unit is detachable from the jig, and
    wherein one of the jig and the heat transfer unit comprises a protrusion protruding toward the other of the jig and the heat transfer unit, and
    the other of the jig and the heat transfer unit comprises an indented portion compatible with the protrusion.

\* \* \* \* \*